United States Patent
Jang et al.

(10) Patent No.: US 11,437,118 B2
(45) Date of Patent: Sep. 6, 2022

(54) MEMORY DEVICE AND TEST METHOD THEREOF

(71) Applicant: SAMSUNG ELECTRONICS CO., LTD., Suwon-si (KR)

(72) Inventors: Sungik Jang, Yongin-si (KR); Kihyun Kim, Hwaseong-si (KR); Soojin Ann, Ansan-si (KR); Chungki Lee, Seoul (KR); Dongguk Han, Gwangju (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 2 days.

(21) Appl. No.: 17/073,682

(22) Filed: Oct. 19, 2020

(65) Prior Publication Data

US 2021/0313001 A1   Oct. 7, 2021

(30) Foreign Application Priority Data

Apr. 1, 2020   (KR) .......................... 10-2020-0039785

(51) Int. Cl.

| | |
|---|---|
| *G11C 29/00* | (2006.01) |
| *G11C 29/38* | (2006.01) |
| *H01L 25/065* | (2006.01) |
| *G11C 29/44* | (2006.01) |
| *G11C 11/4091* | (2006.01) |
| *G11C 29/34* | (2006.01) |
| *G11C 29/26* | (2006.01) |

(52) U.S. Cl.
CPC .......... *G11C 29/70* (2013.01); *G11C 11/4091* (2013.01); *G11C 29/34* (2013.01); *G11C 29/38* (2013.01); *G11C 29/4401* (2013.01); *H01L 25/0657* (2013.01); *G11C 2029/2602* (2013.01); *H01L 2225/06541* (2013.01)

(58) Field of Classification Search
CPC . G11C 2029/2602; G11C 29/34; G11C 29/38; G11C 11/4091; G11C 29/4401; G11C 29/26; G11C 29/12; G11C 29/56012; G11C 29/28; G11C 11/401; G11C 29/46; G11C 29/70; H01L 25/0657; H01L 2225/06541
See application file for complete search history.

(56) References Cited

U.S. PATENT DOCUMENTS

| | | |
|---|---|---|
| 4,727,474 A | 2/1988 | Batcher |
| 6,442,717 B1 * | 8/2002 | Kim ...................... G11C 29/12 365/201 |
| 7,137,049 B2 | 11/2006 | Hoffmann et al. |

(Continued)

*Primary Examiner* — Steve N Nguyen
(74) *Attorney, Agent, or Firm* — Lee IP Law, P.C.

(57) ABSTRACT

A memory device includes: a plurality of sense amplifier circuits sensing a data bit in response to a parallel test signal from a plurality of banks; a plurality of comparators comparing the data bit from each of the plurality of sense amplifier circuits with a test bit; and a logic circuit receiving output signals of the plurality of comparators and outputting a test result, wherein each of the plurality of comparators receives the test bit, an evolved parallel bit test (PBT) signal, at least one test ignore signal, and a test pass signal, and compares the data bit and the test bit in response to the evolved parallel bit test (PBT) signal, the at least one logic state test setting signal, and the test pass signal, and passes a corresponding bank regardless of a test operation in response to the test pass signal.

13 Claims, 15 Drawing Sheets

(56) References Cited

U.S. PATENT DOCUMENTS

| | | |
|---|---|---|
| 7,552,368 B2 | 6/2009 | Kim et al. |
| 8,111,568 B2 | 2/2012 | Park |
| 8,537,628 B2 | 9/2013 | Kim et al. |
| 9,583,215 B2 | 2/2017 | Jeong et al. |
| 9,812,220 B2 | 11/2017 | Kim et al. |
| 2004/0221210 A1 | 11/2004 | Hoffmann et al. |
| 2007/0288812 A1* | 12/2007 | Byun .................. G11C 29/40 714/720 |
| 2008/0062785 A1* | 3/2008 | Li ..................... G11C 29/40 365/201 |
| 2010/0054061 A1* | 3/2010 | Park .................. G11C 29/40 365/207 |
| 2014/0032826 A1 | 1/2014 | Lee et al. |
| 2015/0206573 A1* | 7/2015 | Ryu .................. G11C 29/26 365/191 |
| 2017/0352434 A1* | 12/2017 | Ryu .................. G11C 29/54 |

\* cited by examiner

MEMORY DEVICE AND TEST METHOD THEREOF

CROSS-REFERENCE TO RELATED APPLICATION

Korean Patent Application No. 10-2020-0039785, filed on Apr. 1, 2020, in the Korean Intellectual Property Office, and entitled: "Memory Device and Test Method Thereof," is incorporated by reference herein in its entirety.

BACKGROUND

1. Field

The present disclosure relates to a memory device and a testing method thereof.

2. Description of the Related Art

In general, a dynamic random access memory (DRAM) includes a parallel bit test (PBT) circuit for performing a parallel test on a plurality of bits. In a parallel bit test mode, after the same data is written to N (two or more natural numbers) memory cells, N-bit data is read at the same time. The read N-bit data is compared through a comparator to determine whether it is a pass (or "match") or a fail (or "mismatch"). According to such a pass/fail, "1"/"0" is output as test result data. The parallel bit test mode reduces the number of cycles accessing all bits to 1/N, thereby shortening test time compared to a serial test.

SUMMARY

Embodiments are directed to a memory device, including: a plurality of sense amplifier circuits sensing a data bit in response to a parallel test signal from a plurality of banks; a plurality of comparators comparing the data bit from each of the plurality of sense amplifier circuits with a test bit; and a logic circuit receiving output signals of the plurality of comparators and outputting a test result, wherein each of the plurality of comparators receives the test bit, an evolved parallel bit test (PBT) signal, at least one logic state test setting signal, and a test pass signal, compares the data bit and the test bit in response to the evolved parallel bit test (PBT) signal, the at least one logic state test setting signal, and the test pass signal, and passes a corresponding bank regardless of a test operation in response to the test pass signal.

Embodiments are also directed to a memory device, including: a first inverter connected to a first input terminal receiving a data bit read from a bank; a second inverter inverting an evolved parallel bit test signal; a third inverter; a fourth inverter; a fifth inverter; a first NOR gating circuit performing a first NOR operation on an output signal of the second inverter and a test bit, and outputting a result of the first NOR operation to the third inverter; a second NOR gating circuit performing a second NOR operation on a first test ignore signal and a test pass signal and outputting a result of the second NOR operation to the fourth inverter; a third NOR gating circuit performing a third NOR operation on a second test ignore signal and the test pass signal and outputting a result of the third NOR operation to the fifth inverter; a first NAND gating circuit performing a first NAND operation an output signal of the fourth inverter and an output signal of the first NOR gating circuit and outputting a result of the first NAND operation to a second input terminal; a second NAND gating circuit performing a second NAND operation on an output signal the third inverter and an output signal of the fifth inverter and outputting a result of the second NAND operation to a second inverting input terminal; a first PMOS transistor connected between a power terminal and a first node and having a gate connected to the first input terminal; a second PMOS transistor connected between the power terminal and the first node and having a gate connected to the second input terminal; a third PMOS transistor connected between the first node and a second node and having a gate connected to an output terminal of the first input terminal, the second node being connected to an output terminal outputting a result of the parallel bit test operation; a fourth PMOS transistor connected between the first node and the second node and having a gate connected to the second inverting input terminal; a first NMOS transistor connected between the second node and a third node and having a gate connected to the output terminal of the first inverter; a second NMOS transistor connected between the second node and the third node and having a gate connected to the second input terminal; a third NMOS transistor connected between the third node and a ground terminal and having a gate connected to the first input terminal; and a fourth NMOS transistor connected between the third node and the ground terminal and having a gate connected to the second inverting input terminal.

Embodiments are also directed to a memory device, including: a plurality of banks having a plurality of memory cells connected to word lines and bit lines; a row decoder selecting any one of the word lines in response to a row address; a column decoder selecting any one of the bit lines in response to a column address; a sense amplifier circuit sensing a data bit from a memory cell connected to the selected bit line during a parallel bit test operation; a repair control circuit replacing a failed memory cell with a redundant cell in the parallel bit test operation; and a parallel bit test circuit receiving a test command and a test bit from an external device and performing the parallel bit test operation by comparing the data bit received from the plurality of sense amplifier circuits of each of the plurality of banks with the test bit, wherein the parallel bit test circuit passes at least one of the plurality of banks regardless the parallel bit test operation.

Embodiments are also directed to a testing method of a memory device, the method including: receiving a test command, test data, and bank DON'T CARE information; performing a test operation by comparing the test data with data read from each of a plurality of banks in response to the test command in each of the plurality of banks; performing a repair operation on a bank failed in the test operation among the plurality of banks; and passing a non-repairable bank in the repair operation using the bank DON'T CARE information.

BRIEF DESCRIPTION OF DRAWINGS

Features will become apparent to those of skill in the art by describing in detail example embodiments with reference to the attached drawings in which.

DETAILED DESCRIPTION

Figure 1:
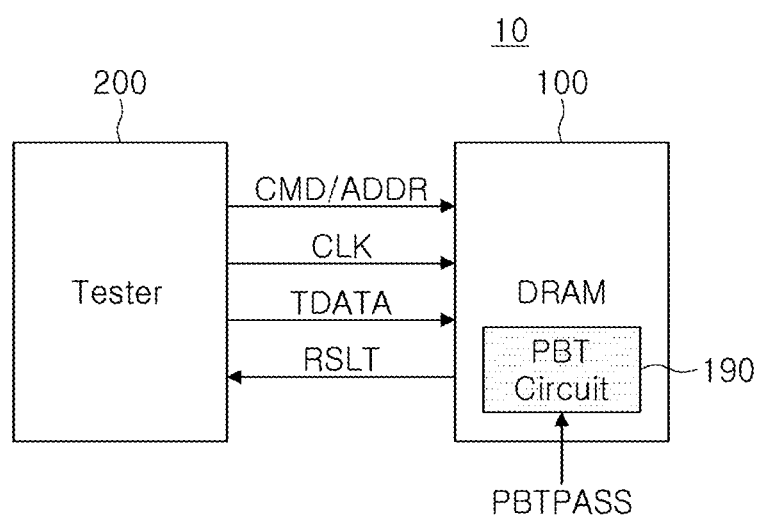
FIG. 1 is a diagram example illustrating a testing system 10 for testing a memory device 100 according to an example embodiment.

FIG. 1 is a diagram example illustrating a testing system 10 for testing a memory device 100 according to an example embodiment.

Referring to FIG. 1, the testing system 10 may include a memory device 100 and a tester 200.

The memory device 100 may be implemented to store data. According to an example embodiment, the memory device 100 may include a plurality of banks. According to an example embodiment, each of the plurality of banks may include a plurality of memory cells connected to word lines and bit lines. According to an example embodiment, each of the memory cells may be a volatile memory cell or a non-volatile memory cell. For example, the memory cell may be a dynamic random access memory (DRAM) cell, a flash memory cell, a magnetoresistive random access memory (MRAM) cell, or a phase-change random access memory (PRAM) cell. According to an example embodiment, the memory device 100 may be a DRAM memory device 100.

The memory device 100 may include a parallel bit test (PBT) circuit 190 for performing a parallel bit test (PBT) operation. The parallel bit test operation may include a test operation for determining whether the memory device 100 is good or fails (defective) by comparing data read from the memory cells after writing test data to the memory cells of the memory device 100.

According to an example embodiment, the PBT circuit 190 may be implemented to pass a predetermined memory region (e.g., a bank) of the memory device 100 regardless of whether or not the predetermined memory region fails in response to a test pass signal PBTPASS in the parallel bit test operation. According to an example embodiment, the test pass signal PBTPASS may be generated by a mode register set (MRS). According to another example embodiment, the test pass signal PBTPASS may be received from the tester 200.

The tester 200 may be implemented to transmit a command/address (CMD/ADDR), clock (CLK), and test data (TDATA) related to the test operation to the memory device 100 in the test operation, and to receive a result value (RSLT) of the test operation from the memory device 100.

The testing system 10 according to an example embodiment may process a test pass for the predetermined region of the memory device 100 using the test pass signal PBTPASS. Thus, the testing system 10 according to the present example embodiment may overcome statistical limitations of a reliability evaluation sample size, and greatly shorten a development period of the memory device 100, by skipping the test operation for a specific region of the memory device 100.

Figure 2:
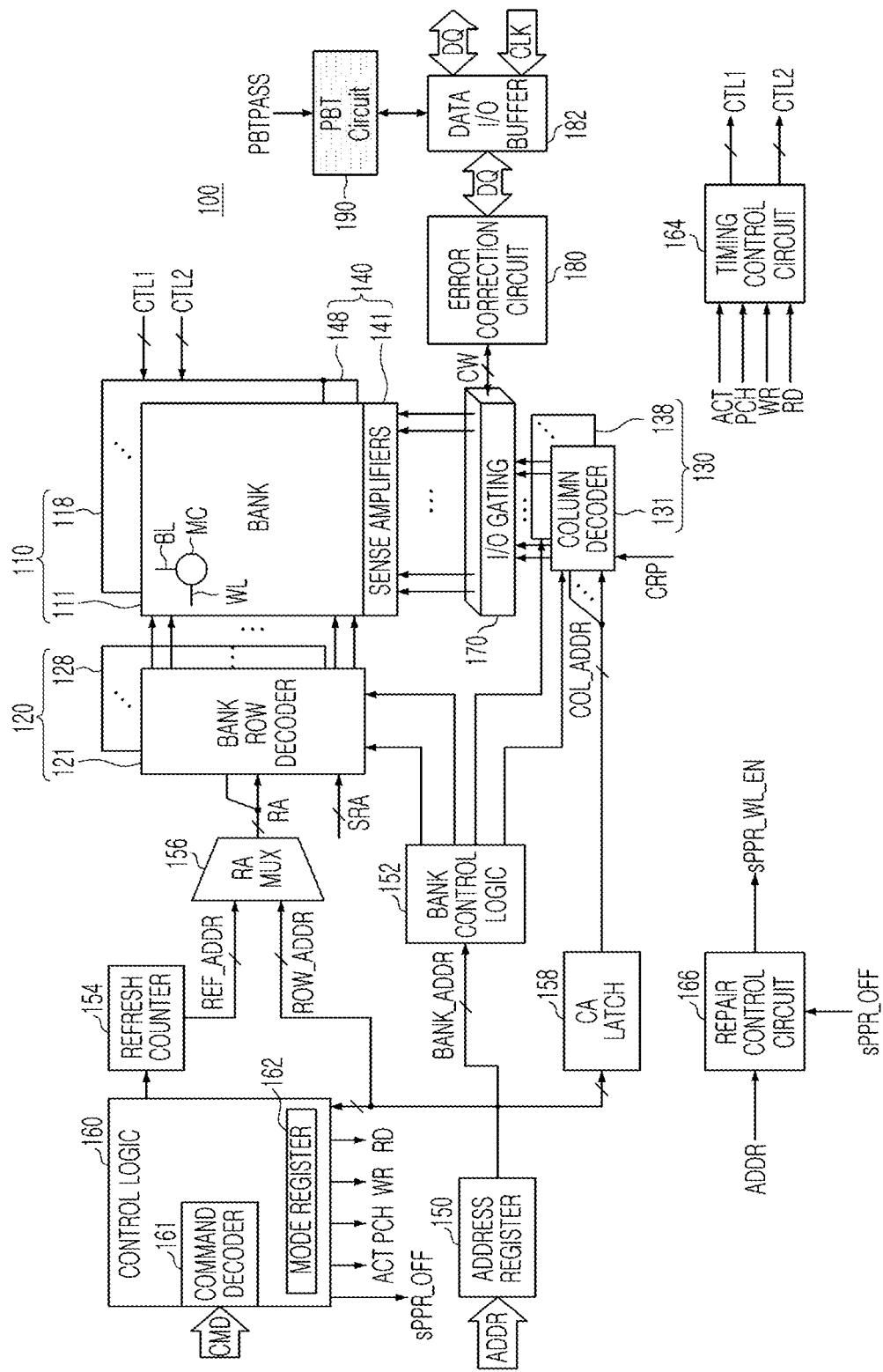
FIG. 2 is a diagram example illustrating a memory device 100 according to an example embodiment.

FIG. 2 is a diagram illustrating a memory device 100 according to an example embodiment.

Referring to FIG. 2, the memory device 100 may include a memory cell array 110, a row decoder 120, a column decoder 130, a sense amplifier circuit 140, an address register 150, a bank control logic 152, a refresh counter 154, a row address multiplexer 156, a column address latch 158, a control logic 160, a repair control circuit 166, a timing control circuit 164, an input/output gating circuit 170, an error correction circuit 180, a data input/output buffer 182, and the PBT circuit 190.

The memory cell array 110 may include first to eighth banks 111 to 118, although it should be understood that the number of banks of the memory cell array 110 may be varied.

The row decoder 120 may include first to eighth bank row decoders 121 to 128 connected to the first to eighth banks 111 to 118, respectively.

The column decoder 130 may include first to eighth bank column decoders 131 to 138 connected to the first to eighth banks 111 to 118, respectively.

The sense amplifier circuit 140 may include first to eighth sense amplifiers 141 to 148 connected to the first to eighth banks 111 to 118, respectively.

The first to eighth banks 111 to 118, the first to eighth bank row decoders 121 to 128, the first to eighth bank column decoders 131 to 138, and the first to eighth banks sense amplifiers 141 to 148 may configure the first to eighth banks, respectively. Each of the first to eighth banks 111 to 118 may include a plurality of memory cells MCs formed at a point at which word lines WL and bit lines BL intersect.

The address register 150 may receive and store an address ADDR having a bank address BANK_ADDR, a row address ROW_ADDR, and a column address COL_ADDR from an external memory controller. The address register 150 may provide the received bank address BANK_ADDR to the bank control logic 152, provide the received row address ROW_ADDR to the row address multiplexer 156, and provide the received column address COL_ADDR to the column address latch 158.

The bank control logic 152 may generate bank control signals in response to the bank address BANK_ADDR. A bank row decoder corresponding to the bank address BANK_ADDR among the first to eighth bank row decoders 121 to 128 may be activated in response to the bank control signals. A bank column decoder corresponding to the bank address BANK_ADDR among the first to eighth bank column decoders 131 to 138 may be activated in response to the bank control signals.

The row address multiplexer 156 may receive the row address ROW_ADDR from the address register 150 and receive a refresh row address REF_ADDR from the refresh counter 154. The row address multiplexer 156 may selectively output the row address ROW_ADDR or the refresh row address REF_ADDR as a row address RA. The row addresses RA output from the row address multiplexers 156 may be applied to the first to eighth bank row decoders 121 to 128, respectively.

The bank row decoder activated by the bank control logic 152 among the first to eighth bank row decoders 121 to 128 may decode the row address RA output from the row address multiplexer 156 to activate the word line corresponding to the row address. For example, the activated bank row decoder may apply a word line driving voltage to the word line corresponding to the row address. In addition, the activated bank row decoder may activate the word line corresponding to the row address and at the same time activate a redundancy word line corresponding to a redundancy row address output from the repair control circuit 166.

The column address latch 158 may receive the column address COL_ADDR from the address register 150 and temporarily store the received column address COL_ADDR. In addition, the column address latch 158 may incrementally increase the received column address COL_ADDR, in a burst mode. The column address latch 158 may apply the temporarily stored or incrementally increased column address COL_ADDR to the first to eighth bank column decoders 131 to 138, respectively.

The bank column decoder activated by the bank control logic 152 among the first to eighth bank column decoders 131 to 138 may decode the sense amplifiers corresponding to the bank address BANK_ADDR and the column address COL_ADDR through the input/output gating circuit 170. In addition, the activated bank column decoder may perform a column repair operation in response to a column repair signal CRP output from the repair control circuit 166.

The control logic 160 may be implemented to control an operation of the memory device 100. For example, the control logic 160 may generate control signals so that the memory device 100 performs a writing operation or a reading operation. The control logic 160 may include a command decoder 161 for decoding a command CMD received from the memory controller and a mode register set 162 for setting an operation mode of the memory device 100.

For example, the command decoder 161 may generate operation control signals ACT, PCH, WE, and RD corresponding to the command CMD by decoding a writing enable signal /WE, a row address strobe signal /RAS, a column address strobe signal /CAS, and a chip select signal /CS. The control logic 160 may provide the operation control signals ACT, PCH, WE, and RD to the timing control circuit 164. The control signals ACT, PCH, WR, and RD may include an active signal ACT, a precharge signal PCH, a writing signal WR, and a reading signal RD. The timing control circuit 164 may generate first control signals CTL1 for controlling a voltage level of the word line WL and second control signals CTL2 for controlling a voltage level of the bit line BL in response to the operation control signals ACT, PCH, WR, and RD, and may provide the first control signals CTL1 and the second control signals CTL2 to the memory cell array 110.

The repair control circuit 166 may generate repair control signals CRP and SRP that control a repair operation of a first cell region and a second cell region of at least one of the banks based on fuse information of the row address ROW_ADDR, the column address COL_ADDR, and the word lines of the address ADDR (or access address), respectively. The repair control circuit 166 may provide a redundancy row address to a corresponding bank row decoder, provide the column repair signal CRP to a corresponding bank column decoder, and provide the selection signal and the enable signal SRA to a block control circuit related to a corresponding redundancy array block.

In addition, the repair control circuit 166 may generate an hPPR word line activation signal in response to the address ADDR, in an hPPR mode stored in the mode register set 162. In addition, the repair control circuit 166 may generate a sPPR word line activation signal sPPR_WL_EN in response to the address ADDR, in a sPPR mode stored in the mode register set 162. In addition, the repair control circuit 166 may turn off sPPR logic and generate a normal word line activation signal to access previous data, in a sPPR_OFF mode stored in the mode register set 162. According to an example embodiment, the repair control circuit 166 may vary a repair unit based on the address ADDR and the fuse information. For example, the repair control circuit 166 may vary the type and number of repair address bits based on the address ADDR and the fuse information.

Each of the input/output gating circuits of the input/output gating circuit 170 may include an input data mask logic, read data latches for storing data output from the first to eighth banks 111 to 118, and writing drivers for writing the data to the first to eighth banks 111 to 118, together with circuits for gating input/output data.

A code word (CW) to be read in one of the first to eighth banks 111 to 118 may be sensed by a sense amplifier corresponding to one bank and stored in the read data latches. The code word CW stored in the read data latches may be provided to the memory controller through the data input/output buffer 182 after ECC decoding is performed by the error correction circuit 180. Data DQ to be written to one of the first to eighth banks 111 to 118 may be written to one bank through the writing drivers after ECC encoding is performed by the error correction circuit 180.

The data input/output buffer 182 may provide the data DQ to the error correction circuit 180 based on the clock signal CLK provided from the memory controller in a writing operation, and provide the data DQ provided from the error correction circuit 180 to the memory controller in a reading operation.

The error correction circuit 180 may generate parity bits based on data bits of the data DQ provided from the data input/output buffer 182 in the writing operation and provide a code word CW including the data DQ and the parity bits to the input/output gating circuit 170, and the input/output gating circuit 170 may write the code word CW to the bank.

In addition, the error correction circuit 180 may receive a code word CW read from one bank in a reading operation from the input/output gating circuit 170. The error correction circuit 180 may correct at least one error bit included in the data DQ by performing ECC decoding on the data DQ using the parity bits included in the reading code word CW, thereby providing the corrected error bit to the data input/output buffer 182.

The PBT circuit 190 may be implemented to perform a parallel test operation on the test data TDATA received from the tester 200 (see FIG. 1) and each of the banks, perform a repair operation when error correction is possible, and output a result value according to the result.

In addition, the PBT circuit 190 may be implemented to pass the bank regardless of the result of the test operation of the corresponding bank in response to the test pass signal PBTPASS. According to another example embodiment, the test pass signal PBTPASS may be output from the mode register set 162 at the time of the parallel bit test operation.

The memory device 100 according to an example embodiment may mask the output terminal of such a bank in response to the test pass signal PBTPASS using the repair control circuit 166, even if a non-repairable bank is provided. Accordingly, the memory device 100 according to the present example embodiment may make a failure chip operable as a good chip by controlling the output terminal for each bank.

Figure 3:
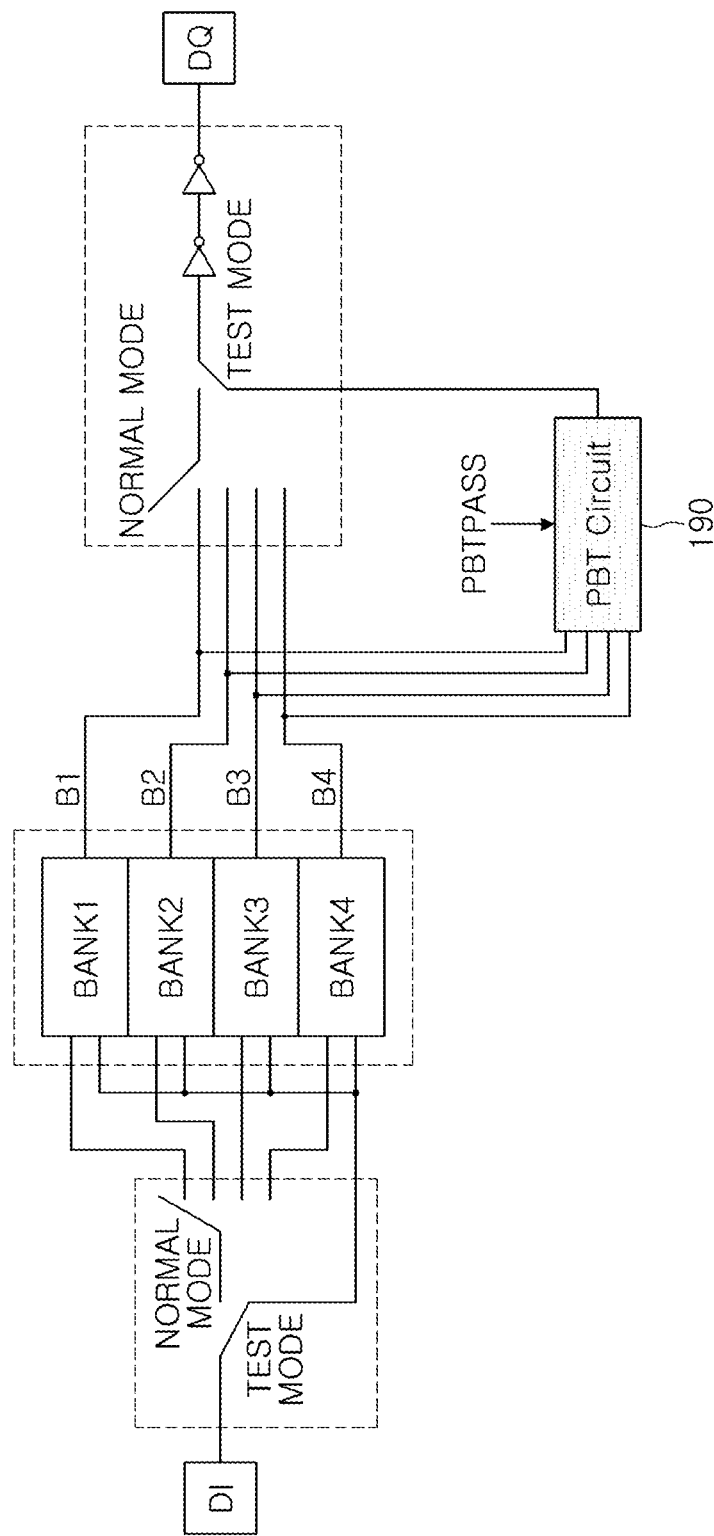
FIG. 3 is a diagram conceptually illustrating a test operation of the memory device 100 according to an example embodiment.

FIG. 3 is a diagram conceptually illustrating a test operation of the memory device 100 according to an example embodiment. Referring to FIG. 3, a data input terminal may select input data DI in one of a normal mode and a test mode. The input data DI may be transmitted to, stored in, and output to a plurality of banks.

The PBT circuit 190 may be implemented to compare outputs of the plurality of banks and output a result value using a comparison output signal corresponding to the result and the test pass signal PBTPASS.

A data output terminal may select either the normal mode or the test mode, and output data DQ to the outside or output the result value of the test operation according to the selected mode.

According to an example embodiment, the operation mode may include the normal mode in which the data is written to or read from each bank, and the parallel test mode in which the plurality of banks are simultaneously written and read. In the normal mode, in order to access a cell in the same manner as that of an operation of a general memory, one word line of one bank and bit lines corresponding to the number of input/output bits may be selected by a combination of the row address and the column address. The data of the memory cell selected as described above may be written or read.

In the test mode, the same data can be written to the plurality of banks. During the reading operation for testing, data of each bank may be received by the PBT circuit 190 through a sense amplifier. When data B1, B2, B3, or B4 of each bank is all "Low" or all "High", the PBT circuit 190 may output a result value corresponding to normal as a result of the test operation. In addition, even if the data B1, B2, B3, or B4 of each bank is not all "Low" or all "High", the PBT circuit 190 may output a result value corresponding to the normal even if a result of a specific bank is a fail, in response to the test pass signal PBTPASS.

Meanwhile, it should be understood that although the number of banks illustrated in FIG. 3 is 4, the number of banks may be varied.

Figure 4:
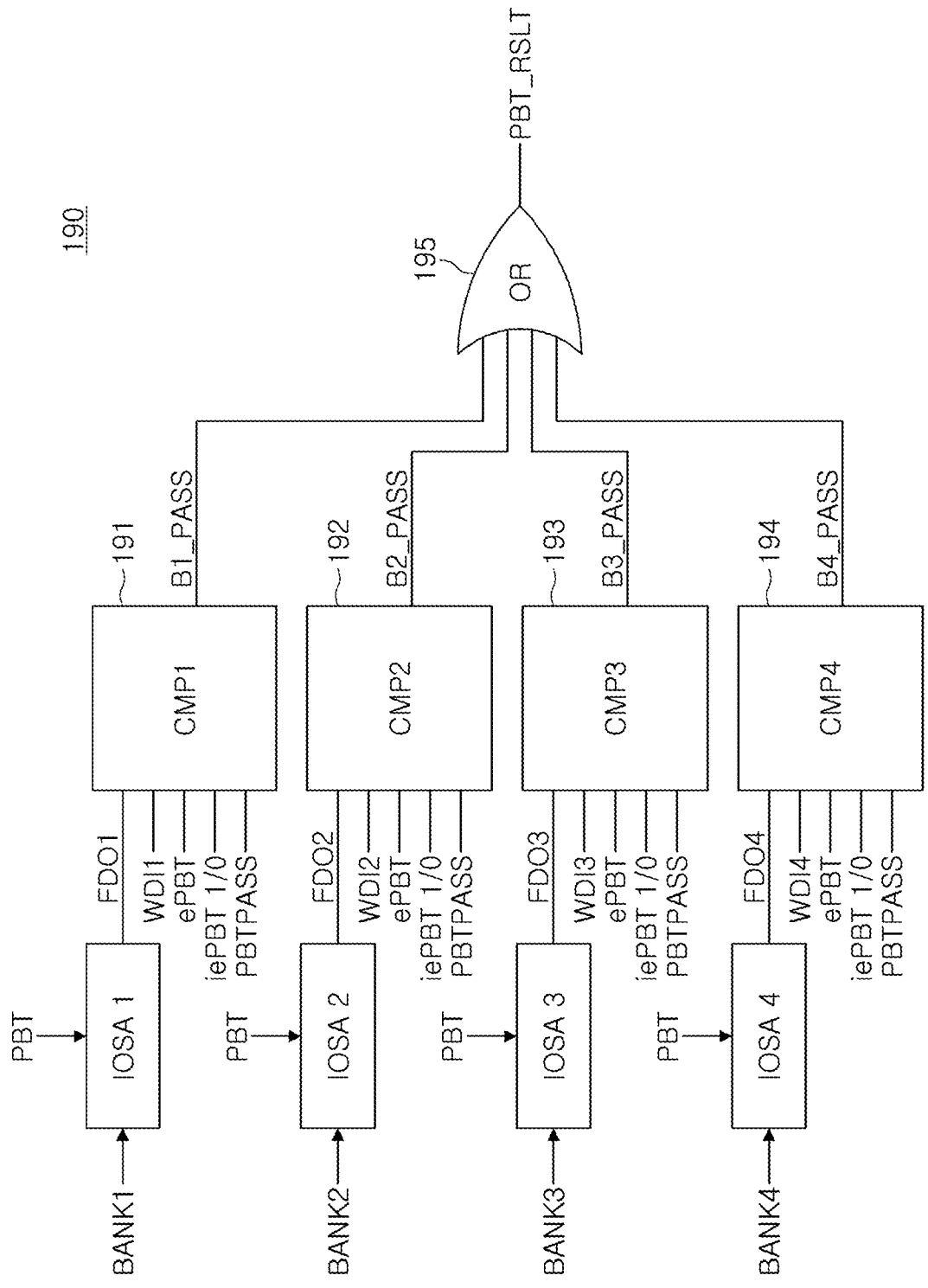
FIG. 4 is a diagram example illustrating a PBT circuit 190 according to an example embodiment.

FIG. 4 is a diagram example illustrating an example embodiment of the PBT circuit 190.

Referring to FIG. 4, the PBT circuit 190 may include first to fourth parallel test circuits 191 to 194 and a logic circuit 195. Herein, the first to fourth parallel test circuits 191 to 194 may be respectively referred to as PBT1 to PBT4.

The first to fourth parallel test circuits 191 to 194 may include respective first to fourth comparators CMP1 to CMP4, which may be implemented to compare the test data input to the tester 200 (see FIG. 1) and the data read from the corresponding bank, and output respective test results B1_PASS to B4_PASS of the banks using the test pass signal PBTPASS and the comparison result.

The first comparator CMP1 (for the first parallel test circuit 191) may be implemented to receive a data bit FDO1, a test bit WDI1, an evolved PBT signal ePBT, a test ignore (or DON'T CARE) signal iePBT 1/0, and a test pass signal PBTPASS, and output a first bank test result signal B1_PASS. The data bit FDO1 may be received from a first input/output sense amplifier circuit IOSA1. The first input/output sense amplifier circuit IOSA1 may receive the parallel bit test signal PBT and sense the data bit FDO1 from the first bank BANK1. The test bit WDI1 may be received from the tester 200, and the received test bit WDI1 may be buffered in an internal latch. The parallel bit test signal PBT, the evolved PBT signal ePBT, the test ignore signal iePBT 1/0, and the test pass signal PBTPASS may be received from the mode register set MRS (162 in FIG. 2).

Each of the second to fourth comparators CMP2 to CMP4 of the respective second to fourth parallel test circuits 192 to 194 may be implemented in the same manner as the first comparator CMP1 of the first parallel test circuit 191. The number of comparators CMP1 to CMP4 illustrated in FIG. 4 is 4, but the number may be varied.

The logic circuit 195 may be implemented to receive the output signals B1_PASS, B2_PASS, B3_PASS, and B4_PASS of the respective comparators CMP1 to CMP4 and output a result value PBT_RSLT of the PBT test operation. For example, the logic circuit 195 may include an OR gating circuit that performs an OR operation. It should be understood that, although the logic circuit 195 illustrated in FIG. 4 is illustrated as an OR gating circuit, the logic circuit according to the present example embodiment may include, e.g., an XOR gating circuit that performs an XOR operation.

Figure 5:
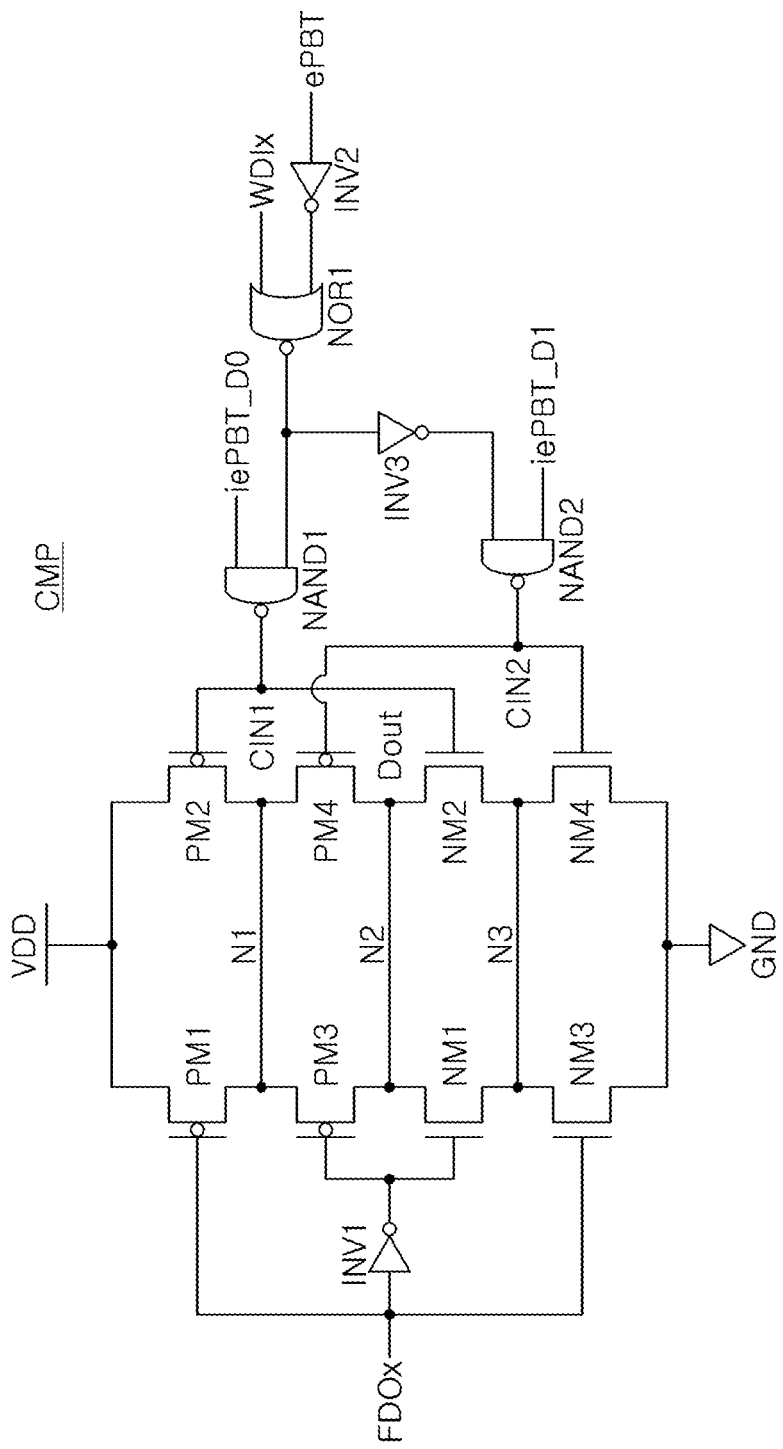
FIG. 5 is a diagram example illustrating a general comparator (CMP) for performing a parallel bit test operation.

FIG. 5 is a diagram example illustrating a general comparator CMP for performing a parallel bit test operation.

Referring to FIG. 5, the comparator CMP may include PMOS transistors PM1 to PM4, NMOS transistors NM1 to NM4, inverters INV1 to INV3, NAND gating circuits NAND1 and NAND2, and a NOR gating circuit NOR1.

The first PMOS transistor PM1 may be connected between a power terminal VDD and a first node N1, and may have a gate connected to a first input terminal FDOx. The first input terminal FDOx may receive data connected to a memory cell through a corresponding sense amplifier.

The second PMOS transistor PM2 may be connected between the power terminal VDD and the first node N1, and may have a gate connected to a second input terminal CIN1. The second input terminal CIN1 may be connected to an output terminal of the first NAND gating circuit NAND1. The first NAND gating circuit NAND1 may be implemented to perform a first NAND operation on a first test ignore signal iePBT_D0 and an output signal of the NOR gating circuit NOR1. The NOR gating circuit NOR1 may be implemented to perform a first NOR operation on test data WDIx received from the tester 200 (see FIG. 1) and an output signal of the second inverter INV2. The second inverter INV2 may be implemented to invert the evolved PBT signal ePBT.

The third PMOS transistor PM3 may be connected between the first node N1 and the second node N2 and may have a gate connected to an output terminal of the first inverter INV1. The first inverter INV1 may be implemented to invert data of the first input terminal FDOx.

The fourth PMOS transistor PM4 may be connected between the first node N1 and the second node N2 and may have a gate connected to a second inverting input terminal CIN2. The inverted second input terminal CIN2 may be connected to an output terminal of the second NAND gating circuit NAND2. The second NAND gating circuit NAND2 may be implemented to perform a second NAND operation on a second test ignore signal iePBT_D1 and an output signal of the third inverter INV3. The third inverter INV3 may be implemented to invert the output signal of the NOR gating circuit NOR1. The second node N2 may include an output terminal Dout of the comparator CMP.

The first NMOS transistor NM1 may be connected between the second node N2 and a third node N3 and may have a gate connected to the output terminal of the first inverter INV1.

The second NMOS transistor NM2 may be connected between the second node N2 and the third node N3 and may have a gate connected to the second input terminal CIN1.

The third NMOS transistor NM3 may be connected between the third node N3 and a ground terminal GND and may have a gate connected to the first input terminal FDOx.

The fourth NMOS transistor NM4 may be connected between the third node N3 and the ground terminal GND and may have a gate connected to the second inverting input terminal CIN2.

The general comparator CMP may perform the test operation while DON'T CARE processing for data of a specific data input/output terminal or DON'T CARE processing for data of a specific logic.

Figure 6A:
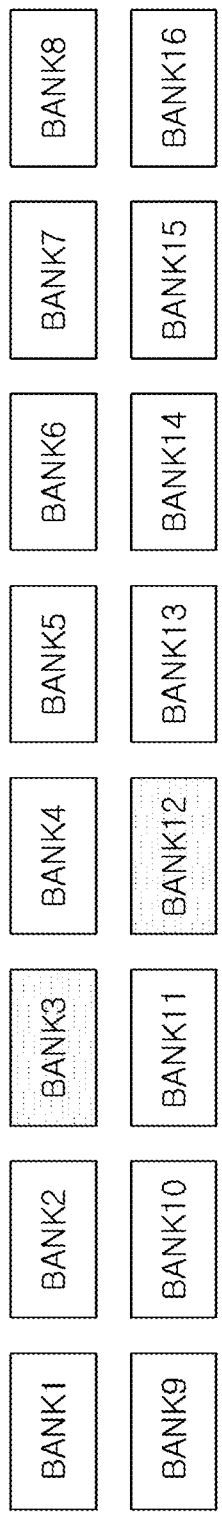
FIGS. 6A and 6B are diagrams example illustrating a process of a parallel bit test operation of a general memory device.
Figure 6B:
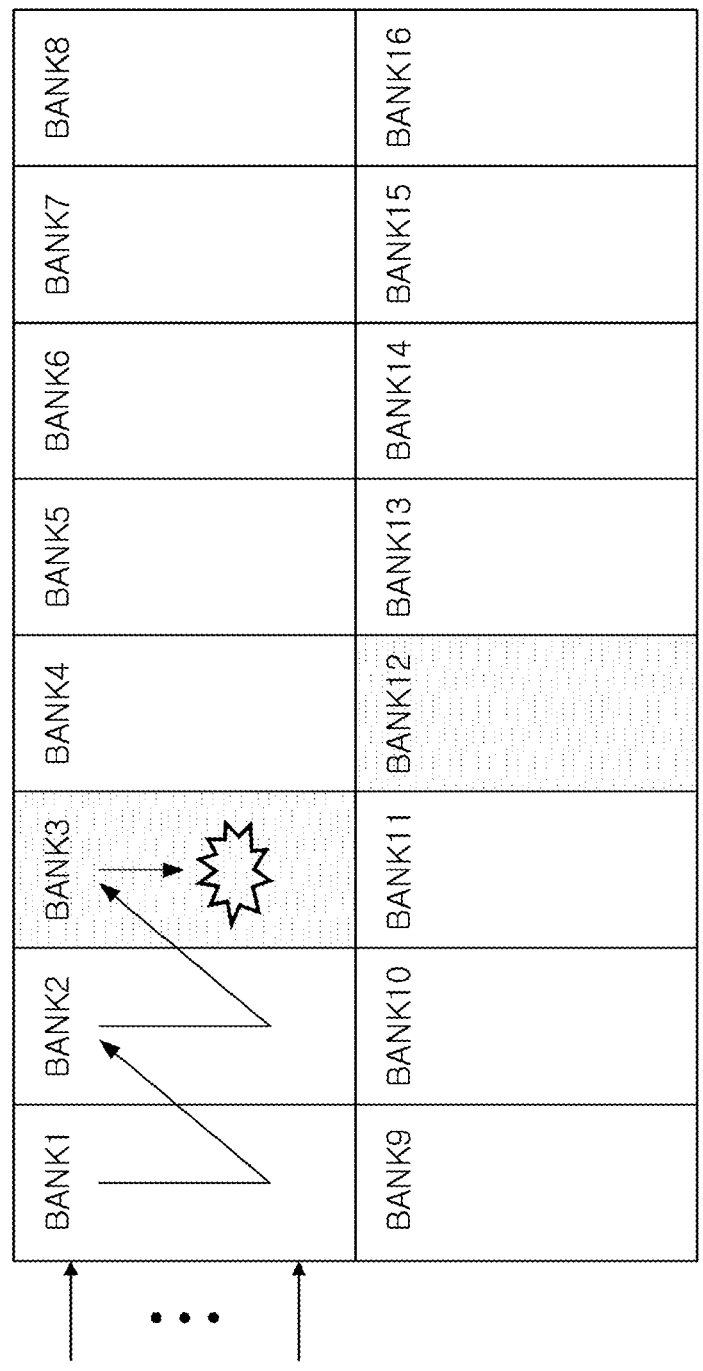

FIGS. 6A and 6B are diagrams example illustrating a process of a parallel bit test operation of a general memory device.

Referring to FIG. 6A, it will be assumed that a third bank BANK3 and a twelfth bank BANK12 are non-repairable as a result of the test and repair operation. As illustrated in FIG. 6B, since the non-repairability is confirmed in the test operation for the third bank BANK3 when performing the parallel test operation for each bank, the memory device will be immediately processed as a fail chip.

A general memory device is processed as a fail chip when any non-repairable bank occurs. As illustrated in FIGS. 6A and 6B, there is no problem in driving the memory device with 14 banks BANK1, BANK2, BANK4 to BANK11, and BANK13 to BANK16 that are not bad, but the corresponding memory device is processed as fail or bad nonetheless. In contrast, the memory device according to an example embodiment may be implemented to pass the bad banks in the parallel bit test operation.

Figure 7:
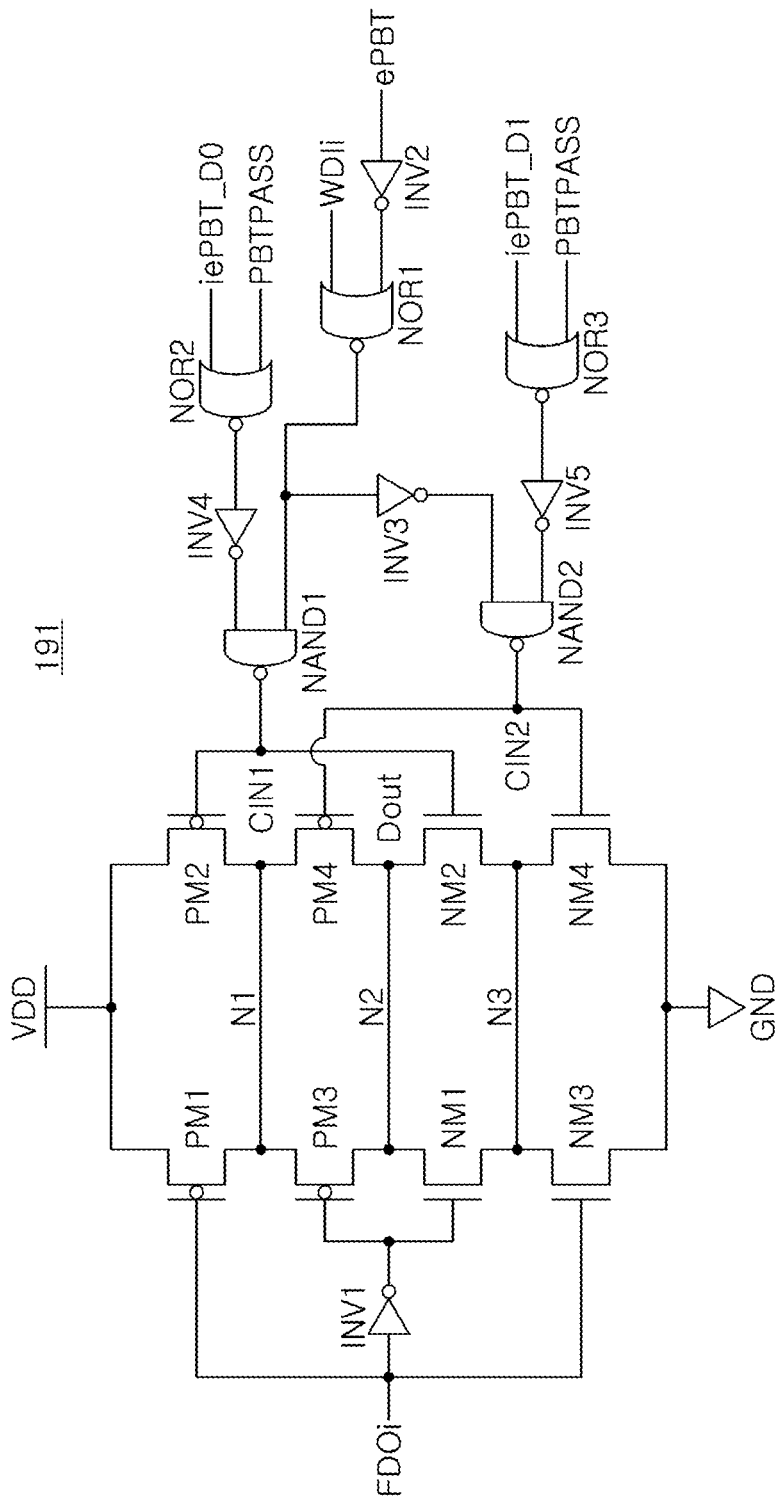
FIG. 7 is a diagram example illustrating a comparator according to an example embodiment.

FIG. 7 is a diagram example illustrating a comparator in a parallel test circuit according to an example embodiment.

Referring to FIG. 7, an example of the comparator CMP1 in the first parallel test circuit 191 according to the present example embodiment may further include a second NOR gating circuit NOR2, a third NOR gating circuit NOR3, a fourth inverter INV4, and a fifth inverter INV5, compared to the comparator CMP illustrated in FIG. 5.

The second NOR gating circuit NOR2 may be implemented to perform a NOR operation on the first test ignore signal iePBT_D0 and the test pass signal PBTPASS. An output terminal of the second NOR gating circuit NOR2 may be connected to an input terminal of the fourth inverter INV4. The first NAND gating circuit NAND1 may be implemented to perform the first NAND operation on an output signal of the fourth inverter INV4 and the output signal of the first NOR gating circuit NOR1.

The third NOR gating circuit NOR3 may be implemented to perform a NOR operation on a second test ignore signal iePBT_D1 and the test pass signal PBTPASS. An output terminal of the third NOR gating circuit NOR3 may be connected to an input terminal of the fifth inverter INV5. The second NAND gating circuit NAND2 may be implemented to perform a second NAND operation on an output signal of the third inverter INV3 and an output signal of the fifth inverter INV5. Here, an input terminal of the third inverter INV3 may be connected to an output terminal of the first NOR gating circuit NOR1.

The memory device 100 according to an example embodiment may include a circuit for passing a fail determination when processing data due to an actual fail through an application of the test pass signal PBTPASS to an ePBT circuit for comparing and outputting the data read from the output terminal of the PBT circuit 190 with a write expected value, and an iePBT circuit for performing DON'T CARE processing on specific data and outputting the specific data. The test pass signal PBTPASS may be controlled for each bank together with iePBT D0/D1.

When comparing a value FDOx output from the PBT Path output through the input/output sense amplifier circuit IOSA and a test expected value WDIx, if a phase of the test pass signal PBTPASS is 'High,' a pass/fail determination of the corresponding data may be processed as DON'T CARE.

According to an example embodiment, the test pass signal PBTPASS may be applied to each bank. Accordingly, when data DON'T CARE of a specific bank (e.g., G0_A) is performed, the data processing result may be passed by applying the test bank signal PBTPASS of the corresponding bank (e.g., G0_A).

The memory device 100 according to an example embodiment may mask data output terminals of some non-repairable regions by controlling the data processing result for each bank. Accordingly, the memory device 100 according to an example embodiment may make a fail chip operable as a pass chip. As a result, parameters of a test die may be secured. For example, when an initial yield is not secured due to a process generation conversion, the test die secured through the application of the test pass signal PBTPASS may be used for wafer level evaluation, stress evaluation, reliability evaluation, and the like. In addition, the test die may also be used for stress evaluation and reliability evaluation of a back-end stage after assembly.

In addition, the memory device according to an example embodiment may overcome statistical limitations due to lack of evaluable sample sizes. As a result, a development period of the memory chip may be shortened and the memory chip may be ramped up early.

Figure 8A:
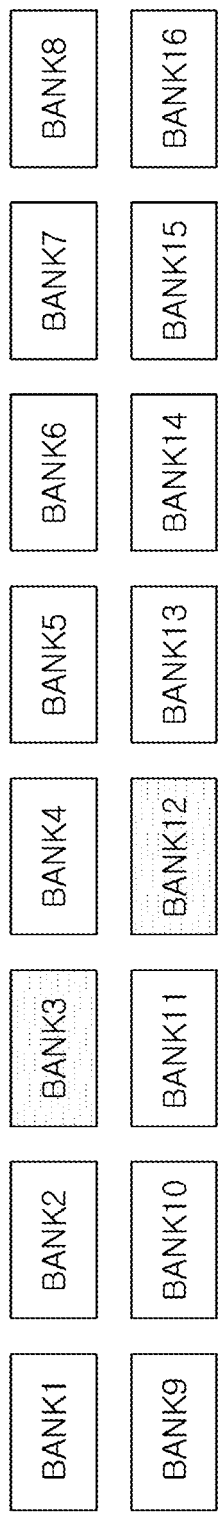
FIGS. 8A and 8B are diagrams example illustrating a process of a parallel bit test operation of a memory device 100 according to an example embodiment.
Figure 8B:
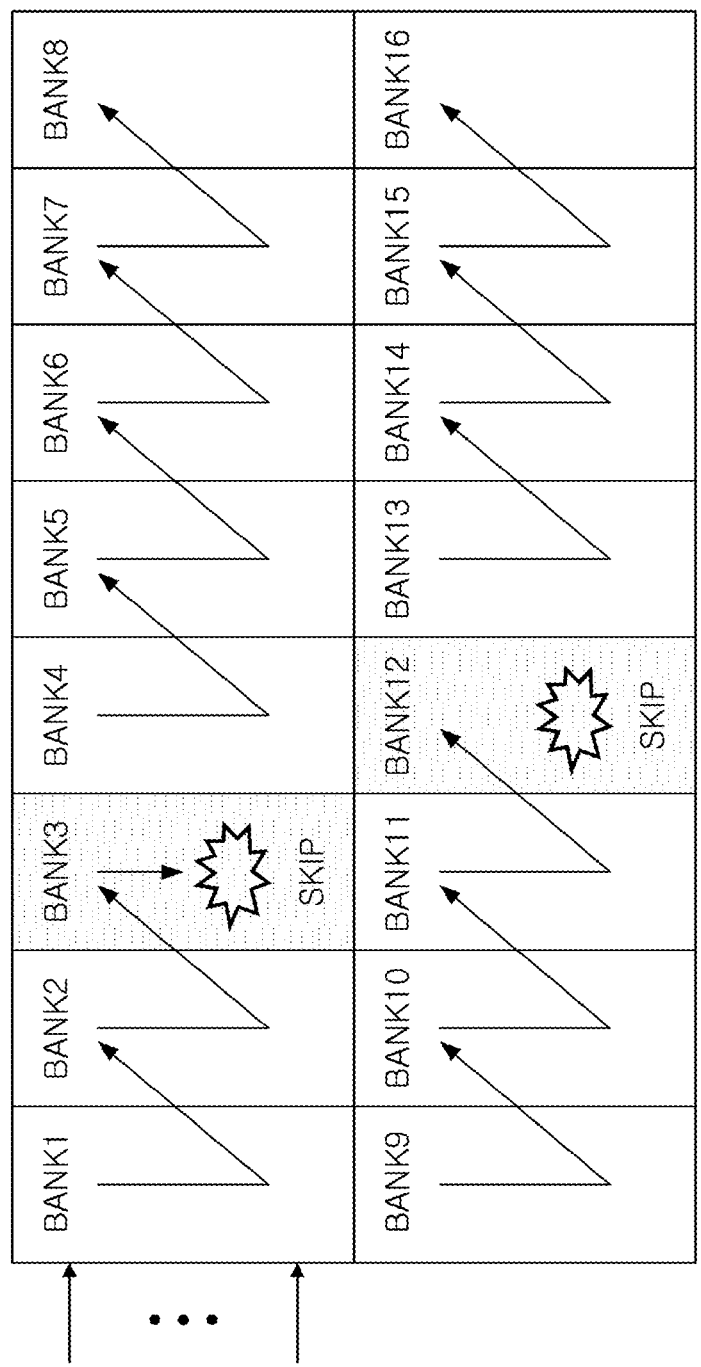

FIGS. 8A and 8B are diagrams example illustrating a process of a parallel bit test operation of a memory device 100 according to an example embodiment.

As illustrated in FIG. 8A, even if the third bank BANK3 and the twelfth bank BANK12 are non-repairable, the memory device 100 according to an example embodiment may complete the test operation while treating specific banks BANK3 and BANK12 as DON'T CARE in the parallel bit test operation, and may be processed as a good chip.

Figure 9:
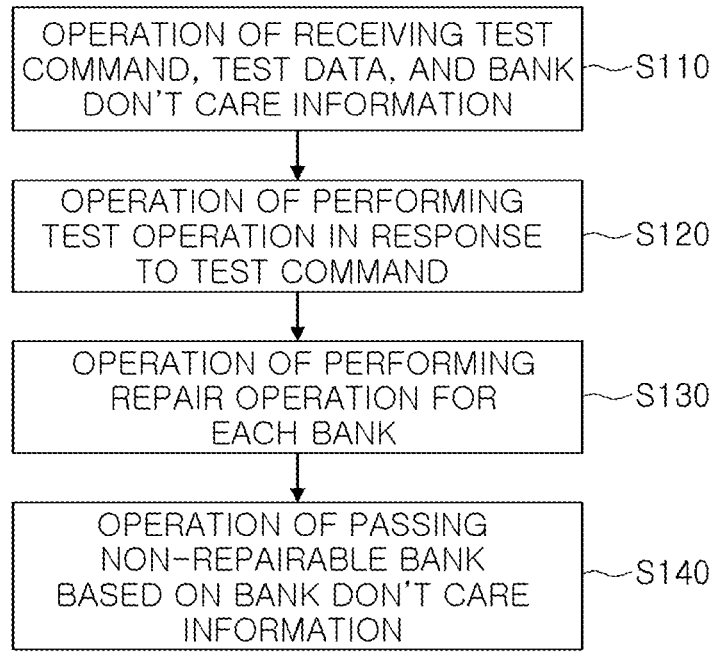
FIG. 9 is a flowchart example illustrating a test operation of the memory device 100 according to an example embodiment.

FIG. 9 is a flowchart example illustrating a test operation of the memory device 100 according to an example embodiment.

Referring to FIGS. 1 through 9, the parallel bit test operation of the memory device 100 may be performed as follows.

The memory device 100 may receive a test command, test data, and bank DON'T CARE information from the tester 200 (see FIG. 1) (S110). The memory device 100 may perform a test operation in each of the plurality of banks in response to the test command (S120). The memory device 100 may perform a repair operation in each of the banks (S130). The memory device 100 may process a non-repairable bank as a pass bank based on the bank DON'T CARE information (S140).

According to an example embodiment, a test pass signal for at least one of the plurality of banks may be generated using the bank DON'T CARE information. According to an example embodiment, the repair operation may include an operation of determining a non-repairable bank among the plurality of banks. According to an example embodiment, in response to the test pass signal, an output terminal of the non-repairable bank may be masked. According to an example embodiment, the repair operation may be performed after skipping a row address RA of the non-repairable bank. According to an example embodiment, the test pass signal may be transmitted to at least one bank group among the plurality of banks.

Figure 10:
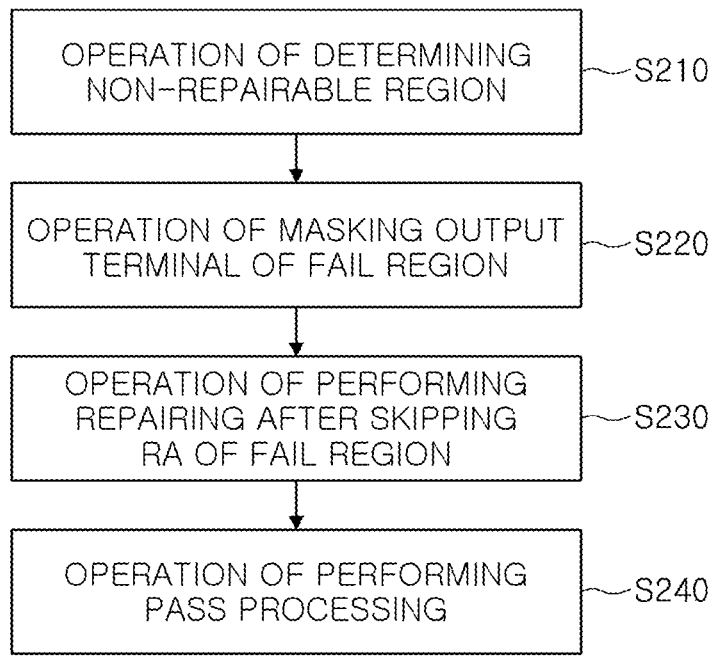
FIG. 10 is a flowchart example illustrating a test operation of the memory device 100 according to another example embodiment in the present disclosure.

FIG. 10 is a flowchart example illustrating a test operation of the memory device 100 according to another example embodiment in the present disclosure.

Referring to FIGS. 1 through 10, the test operation of the memory device 100 may be performed as follows.

The memory device 100 may determine whether a non-repairable region (e.g., a specific bank) exists in the test operation (S210). The memory device 100 may mask an output terminal of a fail region (S220). Thereafter, the memory device 100 may perform a repair operation after skipping an RA of the fail region (S230). The memory device 100 may perform pass processing even if the fail region exists (S240).

Figure 11A:
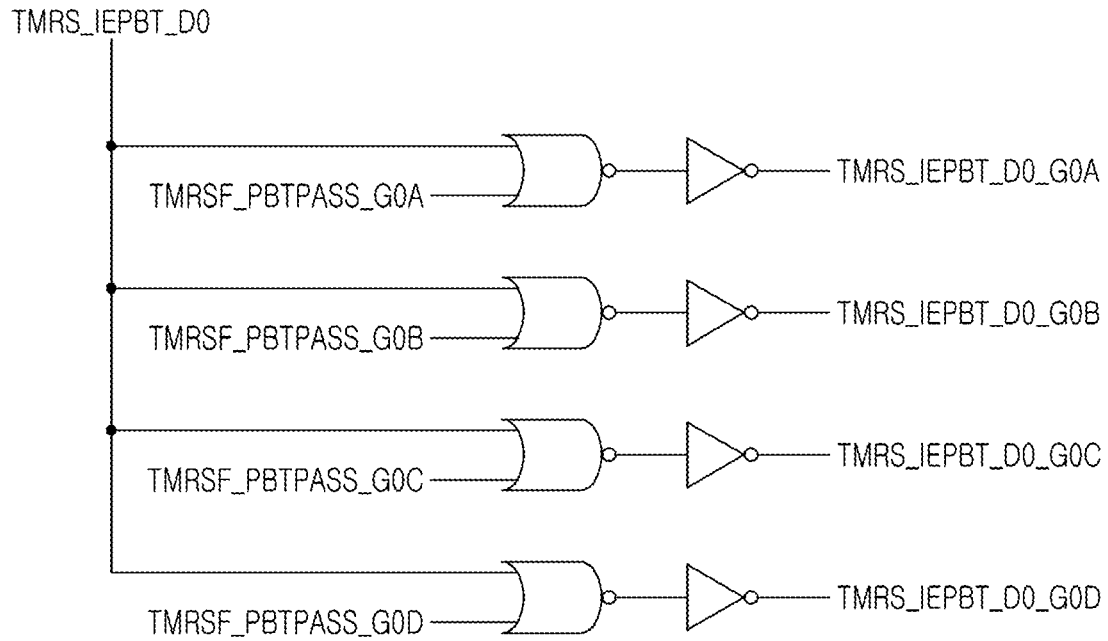
FIGS. 11A and 11B are diagrams illustrating examples of using a test pass signal PBTPASS.
Figure 11B:
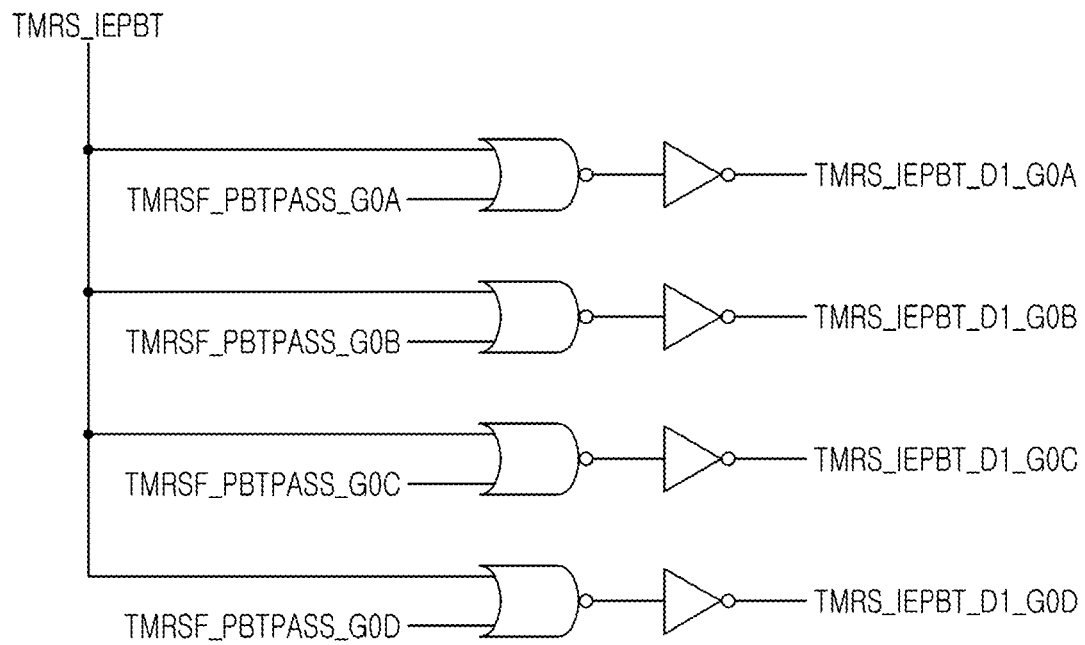

FIGS. 11A and 11B are diagrams illustrating examples of using a test pass signal PBTPASS.

As illustrated in FIGS. 11A and 11B, the test pass signal PBTPASS is applicable to a first bank group G0A, G0B, G0C, and G0D.

An iePBT circuit illustrated in FIG. 11A may perform DON'T CARE processing on specific data by using a first test ignore signal TMRS_IEPBT_D0 and test pass signals TMRSF_PBTPASS_G0A, TMRSF_PBTPASS_G0B, TMRSF_PBTPASS_G0C, and TMRSF_PBTPASS_G0D.

An iePBT circuit illustrated in FIG. 11B may perform DON'T CARE processing by using a PBT signal TRMS IEPBT and the test pass signals TMRSF_PBTPASS_G0A, TMRSF_PBTPASS_G0B, TMRSF_PBTPASS_G0C, and TMRSF_PBTPASS_G0D.

A memory device according to an example embodiment may be implemented in a stack type, as described below.

Figure 12:
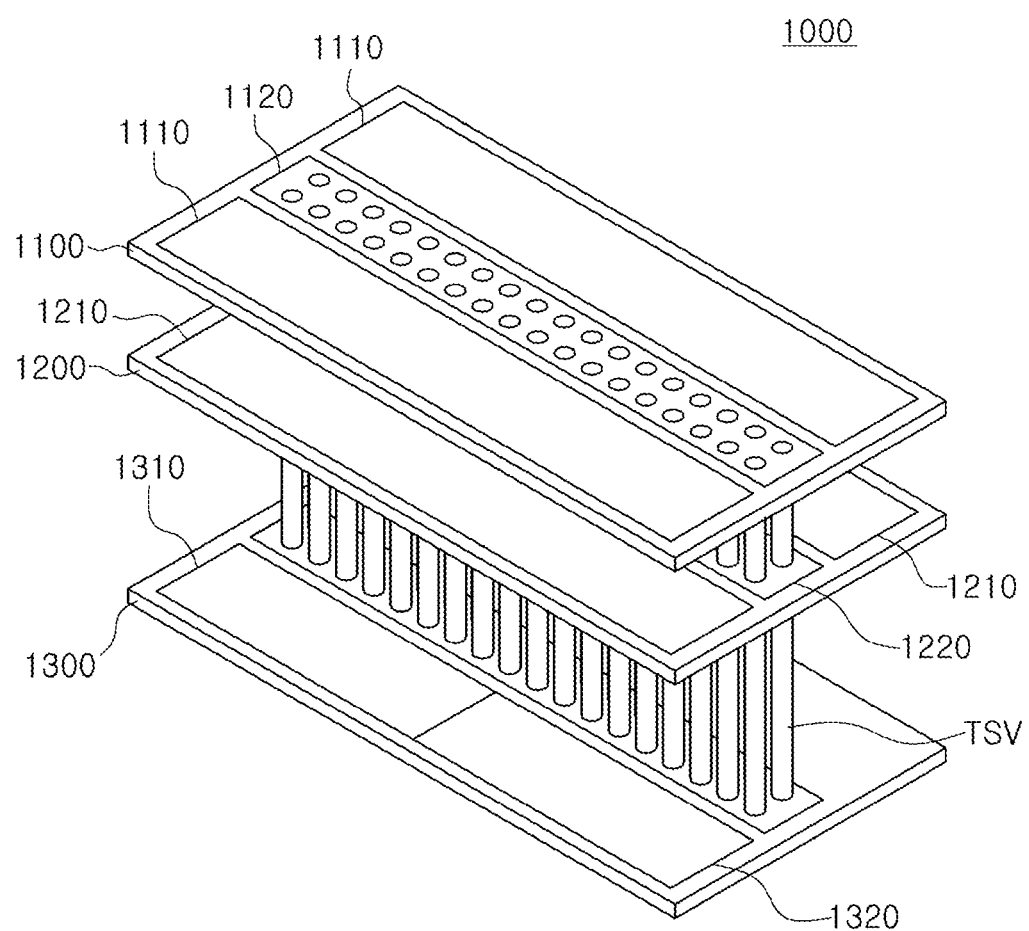
FIG. 12 is a diagram example illustrating a memory chip according to an example embodiment.

FIG. 12 is a diagram example illustrating a memory chip according to an example embodiment.

Referring to FIG. 12, a memory chip 1000 may include first to third memory dies 1100 to 1300 and through silicon vias (TSVs) stacked in a vertical direction on a substrate. The number of stacked memory dies may be varied from that illustrated in FIG. 12. In an example embodiment, the first and second memory dies 1100 and 1200 may be slave dies, and the third memory die 1300 may be a master die or a buffer die.

The first memory die 1100 may include a first memory cell array 1110 and a first through silicon via region 1120 for access to the first memory cell array 1110. The second memory die 1200 may include a second memory cell array 1210 and a second through silicon via region 1220 for accessing the second memory cell array 1210.

The first through silicon via region 1120 may be in which the through silicon vias for communication between the first memory die 1100 and the third memory die 1300 are disposed in the first memory die 1100. Similarly, the second through silicon via region 1220 may be a region in which the through silicon vias for communication between the second memory die 1200 and the third memory die 1300 are disposed in the second memory die 1200. The through silicon vias may provide electrical paths between the first to third memory dies 1100 to 1300. The first to third memory dies 1100 to 1300 may be electrically connected to each other by the through silicon vias. In an example embodiment, the number of through silicon vias may be hundreds to thousands, and the through silicon vias may be disposed in a matrix arrangement.

The third memory die 1300 may include a first peripheral circuit 1310 and a second peripheral circuit 1320. The first peripheral circuit 1310 may include circuits for accessing the first memory die 1100, and the second peripheral circuit 1320 may include circuits for accessing the second memory die 1200. According to an example embodiment, each of the first and second peripheral circuits 1310 and 1320 may be implemented by the method and the device for performing the parallel bit test operation described in FIGS. 1 through 11.

A memory device according to an example embodiment may be applied to a computing system, as described below.

Figure 13:
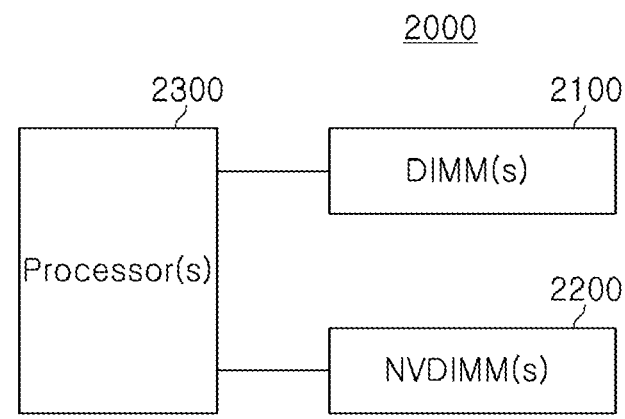
FIG. 13 is a diagram example illustrating a computing system 2000 according to an example embodiment.

FIG. 13 is a diagram example illustrating a computing system 2000 according to an example embodiment.

Referring to FIG. 13, a computing system 2000 may include at least one volatile memory module (DIMM(s)) 2100, at least one non-volatile memory module (NVDIMM(s)) 2200, and at least one central processing unit (CPU(s)) 2300.

The computing system 2000 may be used as a computer, a portable computer, an ultra mobile PC (UMPC), a workstation, a data server, a netbook, a personal digital assistant (PDA), a tablet, a wireless phone, a mobile phone, a smartphone, an ebook, a portable multimedia player (PMP), a digital camera, a digital audio recorder/player, a digital camera/video recorder/player, a portable game machine, a navigation system, a block box, a wearable device, a 3D television, a device that receives and transmits information in a wireless environment, any of a variety of electronic devices that configure a home network, any of a variety of electronic devices that configure a computer network, any of a variety of electronic devices that configure a telematics network, radio frequency identification (RFID), or any of a variety of electronic devices that configure a computing system.

At least one non-volatile memory module 2200 may include at least one non-volatile memory. According to an example embodiment, at least one non-volatile memory may include a NAND flash memory, a vertical NAND flash memory (VNAND), a NOR flash memory, a resistive random access memory (RRAM), a phase-change memory (PRAM), a magnetoresistive random access memory (MRAM), a ferroelectric random access memory (FRAM), a spin transfer torque random access memory (STT-RAM), a thyristor random access memory (TRAM), or the like.

According to an example embodiment, at least one of the memory modules 2100 and 2200 may be implemented to perform the parallel bit test operation described in FIGS. 1 through 11.

According to an example embodiment, the memory modules 2100 and 2200 may be connected to the processor 2300 according to a DDRx (x is an integer of 1 or more) interface.

At least one processor 2300 may be implemented to control the volatile memory module 2100 and the non-volatile memory module 2200. According to an example embodiment, the processor 2300 may include a general purpose microprocessor, a multi-core processor, a digital signal processor (DSP), an application specific integrated circuit (ASIC), or a combination thereof.

A memory device according to an example embodiment may be applied to an automotive system, as described below.

Figure 14:
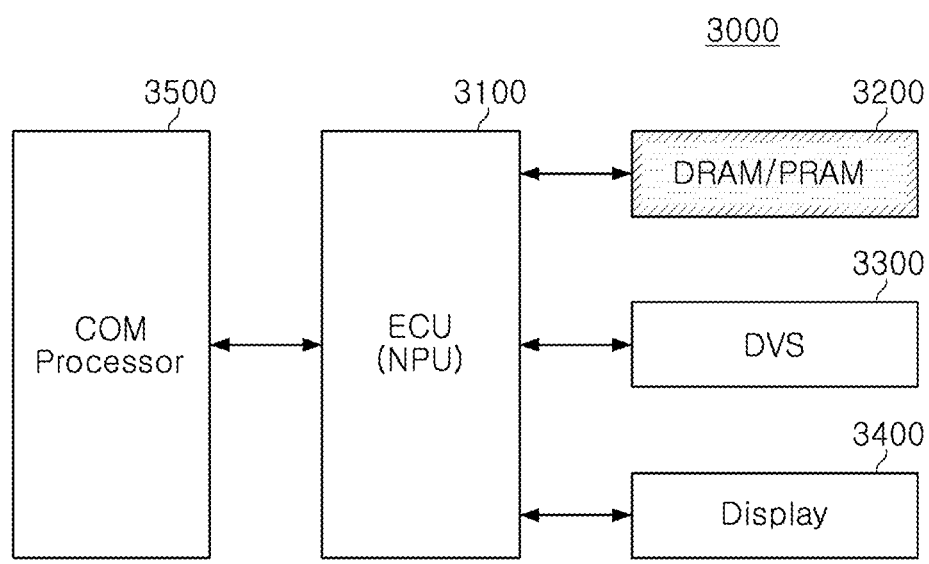
FIG. 14 is a diagram example illustrating an automotive system 3000 according to an example embodiment.

FIG. 14 is a diagram example illustrating an automotive system 3000 according to an example embodiment.

Referring to FIG. 14, an automotive system 3000 may include an electronic control unit (ECU) 3100, a memory device 3200, a dynamic range sensor (DVS) 3300, a display 3400, and a communication processor 3500.

The electronic control unit (ECU) 3100 may be implemented to control an overall operation. The ECU 3100 may process image data received from the DVS 3300. The ECU 3100 may include a neural processing unit (NPU). The NPU may quickly derive an optimal image for driving by comparing the image received from the DVS 3300 with a learning model.

The memory device 3200 may be implemented to store an operation-related learning model of the NPU. The memory device 3200 may include a volatile or non-volatile memory device. For example, the memory device 3200 may be DRAM or PRAM. The memory device 3200 may operate in the parallel bit test mode as described in FIGS. 1 through 11.

The dynamic range sensor (DVS) 3300 may be implemented to sense an environment outside a vehicle. The DVS 3300 may output an event signal in response to a change in relative intensity of light. The DVS 3300 may include a pixel array including a plurality of DVS pixels, and address event processors.

The display 3400 may be implemented to display an image processed by the ECU 3100 or an image transmitted by the communication processor 3500.

The communication processor 3500 may be implemented to transmit the processed image to an external device, for example, an external vehicle, or to receive the image from the external vehicle. The communication processor 3500 may be implemented to perform wired or wireless communication with the external device.

A memory device according to an example embodiment may be applied to a mobile device, as described below.

Figure 15:
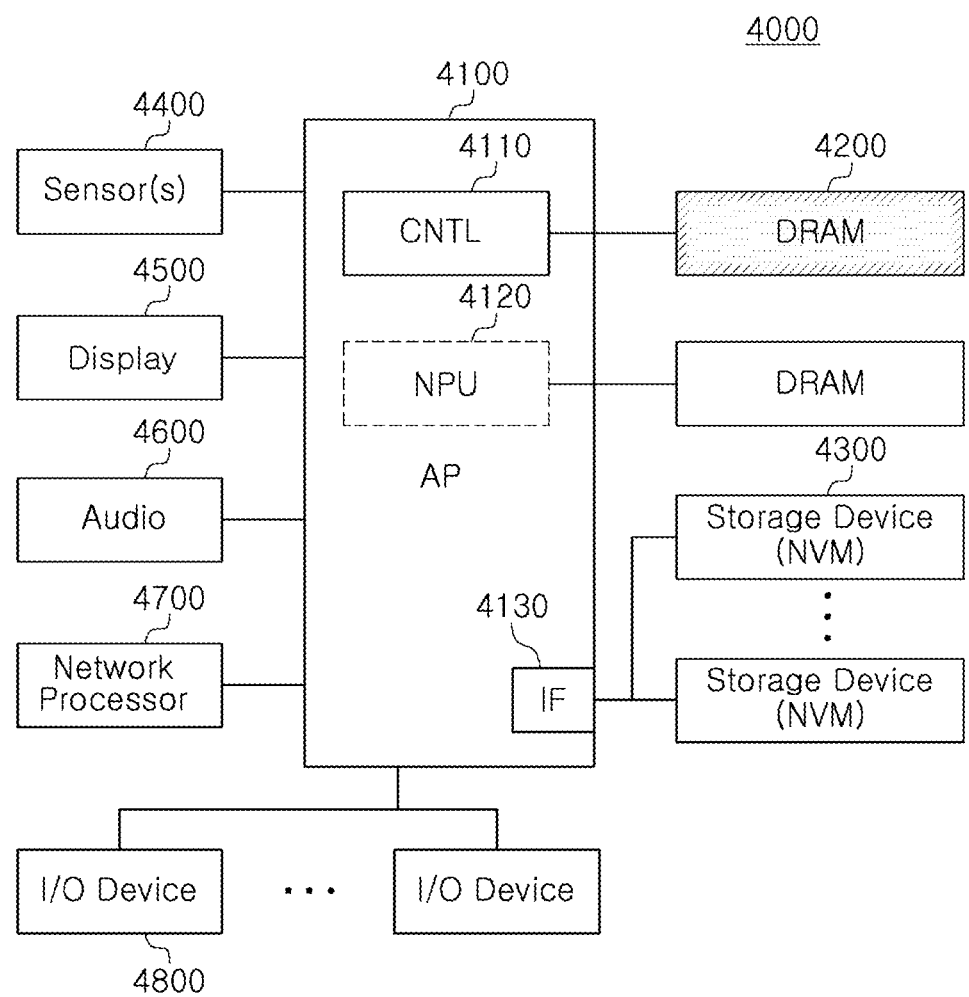
FIG. 15 is a diagram example illustrating a mobile device 4000 according to an example embodiment.

FIG. 15 is a diagram example illustrating a mobile device 4000 according to an example embodiment.

Referring to FIG. 15, a mobile device 4000 may include an application processor 4100, at least one DRAM 4200, at least one storage device 4300, at least one sensor 4400, a display device 4500, an audio device 4600, a network processor 4700, and at least one input/output device 4800. For example, the mobile device 4000 may be implemented as a laptop computer, a mobile phone, a smartphone, a tablet personal computer (PC), or a wearable computer.

The application processor 4100 may be implemented to control an overall operation of the mobile device 4000. The application processor 4100 may execute applications that provide Internet browsers, games, and videos. According to an example embodiment, the application processor 4100 may include a single core or a multi-core. For example, the application processor 4100 may include a multi-core, such as a dual-core, a quad-core, and a hexa-core. According to an example embodiment, the application processor 4100 may further include a cache memory located internally or externally.

The application processor 4100 may include a controller 4110, a neural processing unit (NPU, an artificial intelligence processor) 4120, and an interface 4130. According to an example embodiment, the NPU may be optionally provided.

According to an example embodiment, the application processor 4100 may be implemented as a system-on-chip (SoC). A kernel of an operating system running on the system-on-chip (SoC) may include an I/O scheduler and a device driver for controlling the storage device 4300. The device driver may control an access performance of the storage device 4300 by referring to the number of synchronous queues managed by the input/output scheduler, or control a CPU mode and a DVFS level in the SoC.

The DRAM 4200 may be connected to the controller 4110. The DRAM 4200 may store data necessary for an operation of the application processor 4100. For example, the DRAM 4200 may temporarily store an operating system (OS) and application data, or may be used as an execution space of various software codes.

The DRAM 4200 may perform a sPPR off operation according to a request of the application processor 4100. The DRAM 4200 may be connected to the NPU 4120. The DRAM 4200 may store data related to artificial intelligence operation.

The DRAM 4200 may have a relatively lower latency and higher BW (bandwidth) than an I/O device or a flash memory. The DRAM 4200 may be initialized at the time of Mobile Power-On, and may be loaded with the OS and the application data and may be used as a temporary storage location of the OS and the application data, or may be used as an execution space of various software codes. The mobile system may perform a multitasking operation to load multiple applications at the same time, and switching between applications and execution speed may be used as the performance index of the mobile system.

In addition, the DRAM 4200 may include a PBT circuit that performs a test operation to pass a non-repairable bank as described in FIGS. 1 through 11.

The storage device 4300 may be connected to the interface 4130. According to an example embodiment, the interface 4130 may operate by any one communication protocol of DDR, DDR2, DDR3, DDR4, low power DDR (LPDDR), universal serial bus (USB), multimedia card (MMC), embedded MMC, peripheral component interconnection (PCI), non-volatile memory express (NVMe), peripheral component interconnect express (PCIe), serial at attachment (SATA), small computer system interface (SCSI), serial attached SCSI (SAS), universal storage bus (USB) attached SCSI (UAS), Internet small computer system interface (iSCSI), fiber channel, and fiber channel over Ethernet (FCoE). According to an example embodiment, any one storage device 4300 may be included in the mobile device 4000 in an embedded form. According to another example embodiment, any one storage device 4300 may be included in the mobile device 4000 in a detachable manner.

The storage device 4300 may be implemented to store user data. For example, the storage device 4300 may store data collected from the sensor 4400 or store data network data, augmented reality (AR)/virtual reality (VR) data, and high definition (HD) 4K content. The storage device 4300 may include at least one non-volatile memory device. For example, the storage device 4300 may include a solid state driver (SSD), an embedded multimedia card (eMMC), and the like.

According to an example embodiment, the storage device 4300 may be implemented as a separate chip for the application processor 4100 or may be implemented as a single package with the application processor 4100.

According to an example embodiment, the storage device 4300 may be mounted using various types of packages. For example, the storage device 4300 may be mounted using packages such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flatpack (TQFP), small outline (SOIC), shrink small outline package (SSOP), thin small outline (TSOP), system in package (SIP), multi chip package (MCP), wafer-level fabricated package (WFP), and wafer-level processed stack package (WSP).

The sensor 4400 may be implemented to sense an external environment of the mobile device 4000. According to an example embodiment, the sensor 4400 may include an image sensor that senses an image. The sensor 4400 may transmit generated image information to the application processor 4100. According to another example embodiment, the sensor 4400 may include a biosensor that senses biometric information. For example, the sensor 4400 may sense a fingerprint, an iris pattern, a blood vessel pattern, a heart rate, a blood sugar, and the like, and generate sensing data corresponding to the sensed information. It should be understood that the sensor 4400 may include any suitable sensor, such as an illuminance sensor, an acoustic sensor, and an acceleration sensor.

The display device 4500 may be implemented to output data. For example, the display device 4500 may output the image data sensed using the sensor 4400 or output the data calculated using the application processor 4100.

The audio device 4600 may be implemented to output voice data to the outside or to sense external voice.

The network processor 4700 may be implemented to connect communication with an external device through a wired or wireless communication method.

The input/output device 4800 may be implemented to input data to the mobile device 4000 or to output data from the mobile device 4000. The input/output device 4800 may include devices that provide digital input and output functions such as a USB or storage, a digital camera, an SD card, a touch screen, a DVD, a modem, and a network adapter.

A memory device according to an example embodiment may be applied to various types of computing systems (e.g., CPU/GPU/NPU platforms), as described below.

Figure 16:
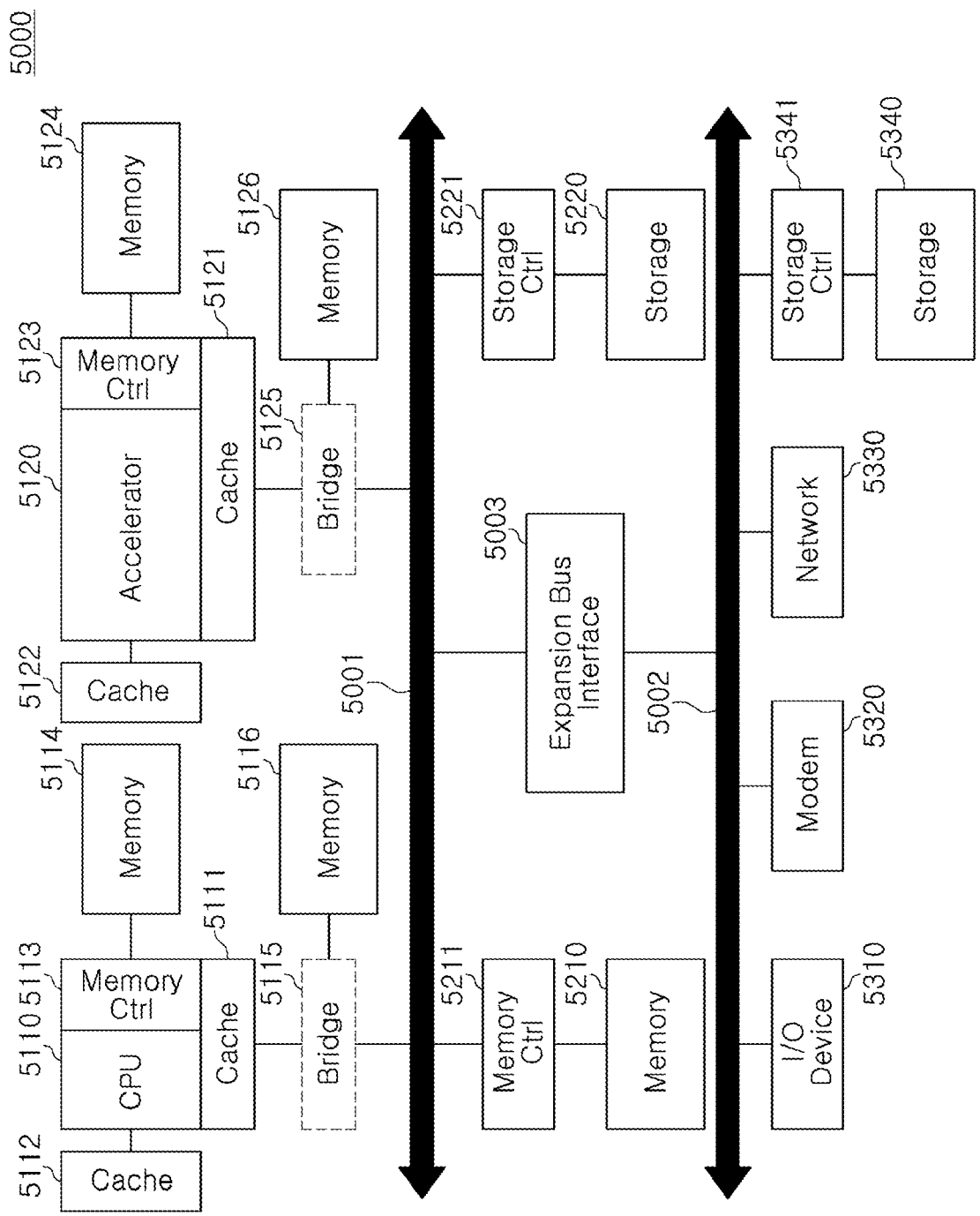
FIG. 16 is a diagram example illustrating a computing system 5000 according to an example embodiment.

FIG. 16 is a diagram example illustrating a computing system 5000 according to an example embodiment.

Referring to FIG. 16, a computing system may include a central processing unit (CPU) 5110, a graphic processing unit (CPU) 5120, or a neural processing unit (NPU) 5130 (or application-specific processing unit) connected to a system bus 5001, a memory device 5210 or a storage device 5220 connected to the system bus 5001, and an input/output device 5310, a modem 5320, a network device 5330, or a storage device 5340 connected to an expansion bus 5002. The expansion bus 5002 may be connected to the system bus 5001 through an expansion bus interface 5003.

According to an example embodiment, each of the CPU 5110, the GPU 5120, and the NPU 5130 may include on-chip caches 5111, 5121, and 5131.

According to an example embodiment, the CPU 5110 may include an off-chip cache 5112. Although not illustrated in FIG. 16, each of the GPU 5120 and the NPU 5130 may also include an off-chip cache. According to an example embodiment, the off-chip cache 5112 may be internally connected to the CPU 5110, the GPU 5120, and the NPU 5130 through different buses.

According to an example embodiment, the on-chip/off-chip cache may include a volatile memory such as a dynamic random access memory (DRAM) or a static random access memory (SRAM), or a non-volatile memory such as a NAND flash memory, a phase random access memory (PRAM), or a resistive random access memory (RRAM).

According to an example embodiment, main memories 5114, 5124, and 5134 may be connected to the CPU 5110, the GPU 5120, and the NPU 5130 through corresponding memory controllers 5113, 5123, and 5133. According to an example embodiment, memories 5116, 5126, and 5136 may be connected to the CPU 5110, the GPU 5120, and the NPU 5130 through bridges 5115, 5125, and 5135. The bridges 5115, 5125, and 5135 may include memory controllers that control the corresponding memories 5116, 5126, and 5136. According to an example embodiment, each of the bridges 5115, 5125, 5135 may be implemented as a network device, a wireless network device, a switch, a bus, a cloud, or an optical channel.

According to example embodiments, the memories 5124 and 5126 may include a GPU memory. The GPU memory may hold commands and data that may interact with the GPU. The commands and the data may be copied from the main memory or storage. The GPU memory may store image data and may have a larger bandwidth than the memory. The GPU memory may separate a clock from the CPU. The GPU may read image data from GPU memory, process the image data, and then write the image data to the GPU memory. The GPU memory may be configured to accelerate graphics processing.

According to example embodiments, the memories 5134 and 5136 may include an NPU memory. The NPU memory may hold commands and data that may interact with the NPU. The commands and the data may be copied from the main memory or storage. The NPU memory may hold weight data for a neural network. The NPU memory may have a larger bandwidth than the memory. The NPU memory may separate a clock from the CPU. The NPU may read the weight data from the NPU memory and update the weight data, and then write the weight data to the NPU memory during training. The NPU memory may be configured to accelerate machine learning such as neural network training and inference.

According to an example embodiment, each of the main memories 5114, 5116, 5124, 5126, 5134, 5136, and 5210 may be implemented as a memory chip that performs the test operation described in FIGS. 1 through 11.

According to an example embodiment, the main memory may include a volatile memory such as DRAM and SRAM, or a non-volatile memory such as a NAND flash memory, PRAM and RRAM. The main memory may have lower latency and lower capacity than those of secondary storages 5210 and 5220.

The CPU 5110, the GPU 5120, or the NPU 5130 may access the secondary storages 5210 and 5220 through the system bus 5001. The memory device 5210 may be controlled by a memory controller 5211. The memory controller 5211 may be connected to the system bus 5001. The storage device 5220 may be controlled by a storage controller 5221. The storage controller 5221 may be connected to the system bus 5001.

The storage device 5220 may be implemented to store data. The storage controller 5221 may be implemented to read the data from the storage device 5220 and transmit the read data to a host. The storage controller 5221 may be implemented to store the transmitted data in the storage device 5220 in response to a request from the host. Each of the storage device 5220 and the storage controller 5221 may include a buffer that stores metadata, reads a cache to store frequently accessed data, or stores a cache to increase writing efficiency. For example, the writing cache may receive and process a specific number of writing requests.

The storage device 5220 may include a volatile memory such as a hard disk drive (HDD) and a non-volatile memory such as NVRAM, SSD, SCM, and a new memory.

A memory device according to an example embodiment may be applied to a data server system, as described below.

Figure 17:
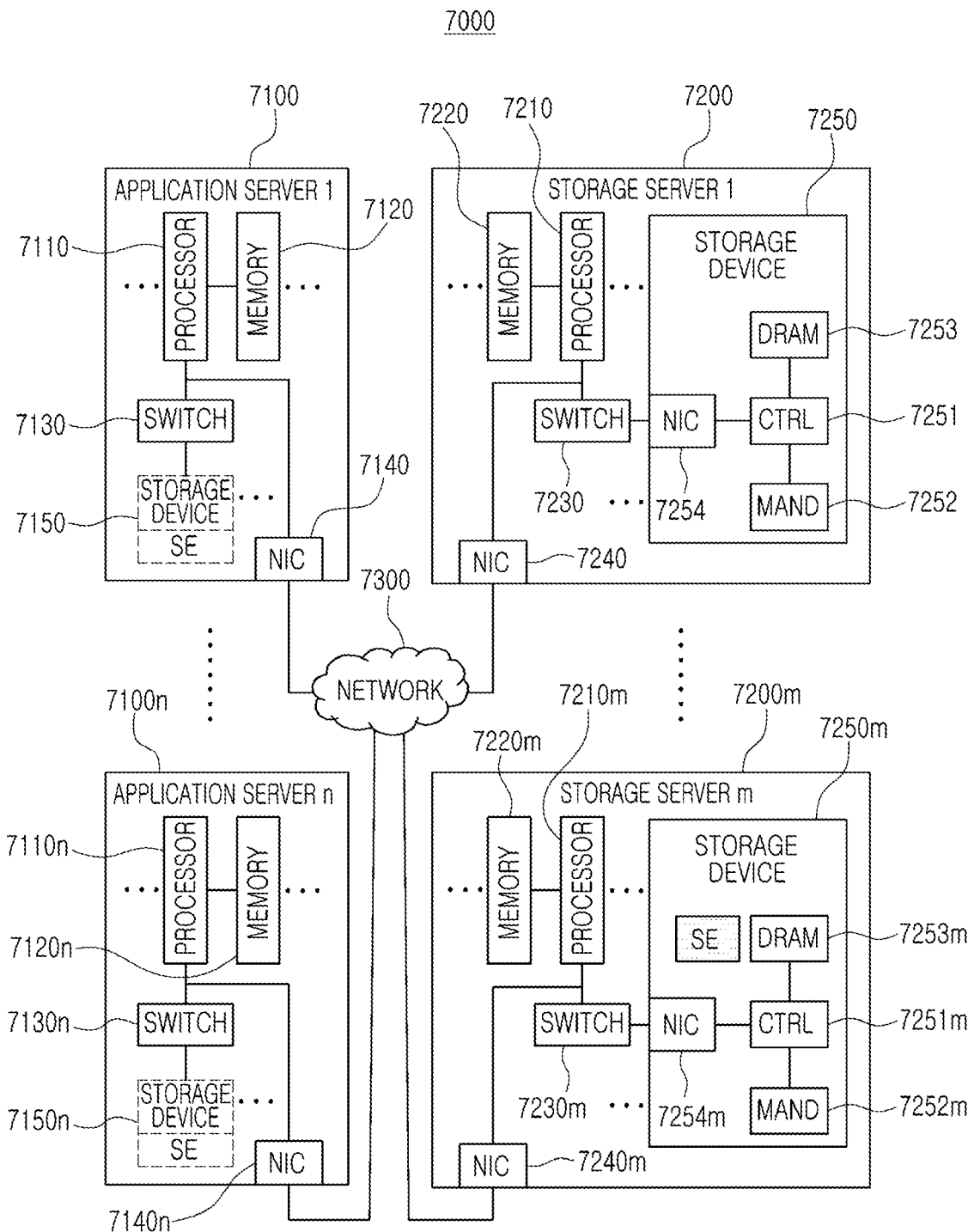
FIG. 17 is a diagram example illustrating a data center 7000 to which the memory device is applied according to an example embodiment.

FIG. 17 is a diagram example illustrating a data center to which the memory device is applied according to an example embodiment.

Referring to FIG. 17, a data center 7000 is a facility that collects various data and provides services, and may be referred to as a data storage center. The data center 7000 may be a system for operating a search engine and a database, or may be a computing system used by companies such as banks or government agencies. The data center 7000 may include application servers 7100 to 7100n and storage servers 7200 to 7200m. The number of application servers 7100 to 7100n and the number of storage servers 7200 to 7200m may be variously selected according to example embodiments, and may be different from each other.

The application server 7100 or the storage server 7200 may include at least one of processors 7110 and 7210 and memories 7120 and 7220. Referring to the storage server 7200 as an example, the processor 7210 may control an overall operation of the storage server 7200, and may access the memory 7220 and execute instructions and/or data loaded in the memory 7220. The memory 7220 may be double data rate synchronous DRAM (DDR SDRAM), high bandwidth memory (HBM), hybrid memory cube (HMC), dual in-line memory module (DIMM), Optane DIMM, or non-volatile DIMM (NVMDIMM). According to an example embodiment, the number of processors 7210 and the number of memories 7220 included in the storage server 7200 may be variously selected. In an example embodiment, the processor 7210 and the memory 7220 may provide a processor-memory pair. In an example embodiment, the number of the processor 7210 and the memory 7220 may be different. The processor 7210 may include a single-core processor or a multi-core processor. The description of the storage server 7200 may be similarly applied to the application server 7100. According to an example embodiment, the application server 7100 may not include a storage device 7150. The storage server 7200 may include one or more storage devices 7250. The number of storage devices 7250 included in the storage server 7200 may be variously selected according to example embodiments.

The application servers 7100 to 7100n and the storage servers 7200 to 7200m may communicate with each other through a network 7300. The network 7300 may be implemented using a Fibre Channel (FC) or Ethernet. At this time, FC may be a medium used for relatively high-speed data transmission, and may use an optical switch providing high performance/high availability. Depending on an access method of the network 7300, the storage servers 7200 to 7200m may be provided as file storage, block storage, or object storage.

In an example embodiment, the network 7300 may be a storage-only network, such as a storage area network (SAN). For example, the SAN may be an FC-SAN using an FC network and implemented according to an FC Protocol (FCP). As another example, the SAN may be an IP-SAN using a TCP/IP network and implemented according to an iSCSI (SCSI over TCP/IP or Internet SCSI) protocol. In another example embodiment, the network 7300 may be a general network such as the TCP/IP network. For example, the network 7300 may be implemented according to protocols such as FC over Ethernet (FCoE), Network Attached Storage (NAS), NVMe over Fabrics (NVMe-oF).

Hereinafter, the application server 7100 and the storage server 7200 will be mainly described. The description of the application server 7100 may be applied to another application server 7100n, and the description of the storage server 7200 may be applied to another storage server 7200m.

The application server 7100 may store data requested by the user or client to be stored in one of the storage servers 7200 to 7200m through the network 7300. In addition, the application server 7100 may acquire data requested by the user or the client to be read from one of the storage servers 7200 to 7200m through the network 7300. For example, the application server 7100 may be implemented as a web server or a database management system (DBMS).

The application server 7100 may access a memory 7120n or a storage device 7150n included in another application server 7100n through the network 7300, or may access memories 7220 to 7220m or storage devices 7250 to 7250m included in the storage servers 7200 to 7200m through the network 7300. Accordingly, the application server 7100 may perform various operations on data stored in the application servers 7100 to 7100n and/or the storage servers 7200 to 7200m. For example, the application server 7100 may execute instructions for moving or copying data between the application servers 7100 to 7100n and/or the storage servers 7200 to 7200m. At this time, the data may be moved to the memories 7120 to 7120n of the application servers 7100 to 7100n through the memories 7220 to 7220m of the storage servers 7200 to 7200m or directly from the storage devices 7250 to 7250m of the storage servers 7200 to 7200m. The data moving through the network 7300 may be encrypted data for security or privacy.

Referring to the storage server 7200 as an example, an interface 7254 may provide a physical connection between the processor 7210 and a controller 7251 and a physical connection between an NIC 7240 and the controller 7251. For example, the interface 7254 may be implemented by a direct attached storage (DAS) method that directly connects the storage device 7250 with a dedicated cable. In addition, for example, the interface 7254 may be implemented by various interface methods such as advanced technology attachment (ATA), serial ATA (SATA), external SATA (e-SATA), small computer small interface (SCSI), serial attached SCSI (SAS), peripheral component interconnection (PCI), PCI express (PCIe), NVM express (NVMe), IEEE 1394, universal serial bus (USB), secure digital (SD) card, multi-media card (MMC), embedded multi-media card (eMMC), universal flash storage (UFS), embedded universal flash storage (eUFS), and compact flash (CF) card interface.

The storage server 7200 may further include a switch 7230 and a NIC 7240. The switch 7230 may selectively connect the processor 7210 and the storage device 7250 or selectively connect the NIC 7240 and the storage device 7250 under the control of the processor 7210.

In an example embodiment, the NIC 7240 may include a network interface card, a network adapter, and the like. The NIC 7240 may be connected to the network 7300 by a wired interface, a wireless interface, a Bluetooth interface, an optical interface, or the like. The NIC 7240 may include an internal memory, a DSP, a host bus interface, and the like, and may be connected to the processor 7210 and/or the switch 7230 through a host bus interface. The host bus interface may be implemented as one of the examples of the interface 7254 described above. In an example embodiment, the MC 7240 may be integrated with at least one of the processor 7210, the switch 7230, and the storage device 7250.

In the storage servers 7200 to 7200*m* or the application servers 7100 to 7100*n*, the processor may program or read data by transmitting a command to the storage devices 7130 to 7130*n* and 7250 to 7250*m*, or the memories 7120 to 7120*n* and 7220 to 7220*m*. At this time, the data may be error-corrected data through an error correction code (ECC) engine. The data is data bus inversion (DBI) or data masking (DM) processed data, and may include cyclic redundancy code (CRC) information. The data may be encrypted data for security or privacy.

The storage devices 7150 to 7150*m* and 7250 to 7250*m* may transmit a control signal and a command/address signal to the NAND flash memory devices 7252 to 7252*m* in response to a reading command received from the processor. Accordingly, when data is read from the NAND flash memory devices 7252 to 7252*m*, a read enable (RE) signal is input as a data output control signal, and may serve to output the data to a DQ bus. A data strobe (DQS) may be generated using the RE signal. The command and the address signal may be latched in a page buffer according to a rising edge or a falling edge of a writing enable (WE) signal.

The controller 7251 may control an overall operation of the storage device 7250. In an example embodiment, the controller 7251 may include a static random access memory (SRAM). The controller 7251 may write the data to the NAND flash 7252 in response to a writing command, or may read the data from the NAND flash 7252 in response to a reading command. For example, the writing command and/or the reading command may be provided from the processor 7210 in the storage server 7200, the processor 7210*m* in another storage server 7200*m*, or the processors 7110 and 7110*n* in the application servers 7100 and 7100*n*. A DRAM 7253 may temporarily store (buffer) the data to be written to the NAND flash 7252 or the data read from the NAND flash 7252. In addition, the DRAM 7253 may store meta data. The meta data may be user data or data generated by the controller 7251 to manage the NAND flash 7252. The storage device 7250 may include a secure element (SE) for security or privacy.

The memory chip according to an example embodiment may include a circuit for passing a fail determination when processing data due to an actual fail through an application of the PBT pass signal to an ePBT circuit for comparing and outputting the data read from the output terminal of the PBT circuit with a write expected value, and an iePBT circuit for performing DON'T CARE processing on specific data and outputting the specific data. In an example embodiment, the PBT pass signal may be controlled for each bank together with iePBT D0/D1.

The memory chip according to an example embodiment may perform DON'T CARE processing on the pass/fail determination of the data, if a phase of the PBT pass signal is 'high' when comparing a value (FDOx) output from a PBT path output through IO S/A with an expected value (WDIx).

In the memory chip according to an example embodiment, the PBT pass is applicable to each bank, and when the data DON'T CARE of a specific bank (e.g., G0_A) is performed, the data processing result may be passed by applying the PBT pass signal of the corresponding bank (e.g., G0_A).

The memory chip according to an example embodiment may control the data processing result for each bank to mask data output terminals of some non-repairable regions, which makes the fail chip operable as the pass chip, thereby securing the parameters of the test die.

In addition, when the initial yield is not secured due to the process generation conversion, the test die secured through the application of the PBT pass signal may be used for wafer level evaluation, stress evaluation, reliability evaluation, and the like, and may also be used for stress evaluation and reliability evaluation of a back-end stage after assembly.

The memory chip according to an example embodiment may overcome statistical limitations due to lack of evaluable sample sizes, and as a result, a development period of the memory chip may be shortened and the memory chip may be early ramped up.

As set forth above, according to an example embodiment, a memory device and a testing method thereof may mask data output terminals of some non-repairable regions by controlling a data processing result for each bank.

According to an example embodiment, a memory device and a testing method thereof may make a fail or bad chip operable as a pass chip.

According to an example embodiment, a memory device and a testing method thereof may secure parameters of a test die.

According to an example embodiment, a memory device and a testing method thereof may be used for stress evaluation and reliability evaluation of a back-end stage after assembly.

As described above, a memory device according to an example embodiment may include a test circuit (e.g., a PBT circuit) that controls masking of an output terminal for each bank. For example, the memory device may mask an output terminal of a non-repairable bank using repair logic. Accordingly, the memory device may operate a product as a normal chip that may be driven by normally outputting only a repairable bank. The memory device may recover an evaluation quantity loss due to an initial low yield/low quality of the product, and maximize an evaluation quantity by converting a fail chip to a good chip by controlling the output terminal for each bank. As a result, the memory device may overcome statistical limitations of a reliability evaluation sample size, and significantly shorten a development period.

As described above, embodiments may provide a memory device and a testing method thereof for improving a yield. Embodiments may also provide a memory device and a testing method thereof for masking an output terminal of a non-repairable bank.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A memory device, comprising:
 a plurality of sense amplifier circuits configured to sense a data bit in response to a first parallel bit test signal from a plurality of banks;

a plurality of comparators configured to compare the data bit from each of the plurality of sense amplifier circuits with a test bit; and
a logic circuit configured to receive output signals of the plurality of comparators and to output a test result, wherein:
each of the plurality of comparators receives:
the test bit,
a second parallel bit test signal,
at least one logic state test setting signal, and
a test pass signal for a bank to be passed regardless of a parallel bit test operation, the test pass signal being controlled for each bank together with at least one test ignore signal,
each of the plurality of comparators compares the data bit and the test bit in response to the second parallel bit test signal, the at least one logic state test setting signal, and the test pass signal, and
each of the plurality of comparators passes a corresponding bank regardless of a test operation in response to the test pass signal.

2. The memory device as claimed in claim 1, wherein each of the plurality of comparators performs a DON'T CARE processing of specific data in response to the at least one logic state test setting signal.

3. The memory device as claimed in claim 1, wherein each of the plurality of comparators receives the test pass signal from a mode register set.

4. The memory device as claimed in claim 3, wherein when comparing the test bit and the data bit, if the test pass signal is a logic 'high,' a parallel bit test circuit makes a DON'T CARE determination of a pass/fail of the corresponding data bit.

5. The memory device as claimed in claim 3, wherein the test pass signal is independently applied to each of the plurality of banks.

6. The memory device as claimed in claim 1, wherein the logic circuit includes an OR gating circuit that outputs a result of the parallel bit test operation by performing an OR operation on the output signals of the plurality of comparators.

7. The memory device as claimed in claim 6, wherein each of the plurality of comparators includes:
a first inverter connected to a first input terminal receiving a data bit read from a corresponding bank among the plurality of banks;
a second inverter configured to invert the second evolved parallel bit test signal;
a third inverter;
a fourth inverter;
a fifth inverter;
a first NOR gating circuit configured to perform a first NOR operation on an output signal of the second inverter and the test bit, and to output a result of the first NOR operation to the third inverter;
a second NOR gating circuit configured to perform a second NOR operation on a first test ignore signal and a test pass signal and to output a result of the second NOR operation to the fourth inverter;
a third NOR gating circuit configured to perform a third NOR operation on a second test ignore signal and the test pass signal and to output a result of the third NOR operation to the fifth inverter;
a first NAND gating circuit configured to perform a first NAND operation an output signal of the fourth inverter and an output signal of the first NOR gating circuit and to output a result of the first NAND operation to a second input terminal;
a second NAND gating circuit configured to perform a second NAND operation on an output signal the third inverter and an output signal of the fifth inverter and to output a result of the second NAND operation to a second inverting input terminal;
a first PMOS transistor connected between a power terminal and a first node and having a gate connected to the first input terminal;
a second PMOS transistor connected between the power terminal and the first node and having a gate connected to the second input terminal;
a third PMOS transistor connected between the first node and a second node and having a gate connected to an output terminal of the first input terminal, the second node being connected to an output terminal outputting a result of the parallel bit test operation;
a fourth PMOS transistor connected between the first node and the second node and having a gate connected to the second inverting input terminal;
a first NMOS transistor connected between the second node and a third node and having a gate connected to the output terminal of the first inverter;
a second NMOS transistor connected between the second node and the third node and having a gate connected to the second input terminal;
a third NMOS transistor connected between the third node and a ground terminal and having a gate connected to the first input terminal; and
a fourth NMOS transistor connected between the third node and the ground terminal and having a gate connected to the second inverting input terminal.

8. A memory device, comprising:
a first inverter connected to a first input terminal receiving a data bit read from a bank;
a second inverter inverting a parallel bit test signal;
a third inverter;
a fourth inverter;
a fifth inverter;
a first NOR gating circuit configured to perform a first NOR operation on an output signal of the second inverter and a test bit, and to output a result of the first NOR operation to the third inverter;
a second NOR gating circuit configured to perform a second NOR operation on a first test ignore signal and a test pass signal and to output a result of the second NOR operation to the fourth inverter;
a third NOR gating circuit configured to perform a third NOR operation on a second test ignore signal and the test pass signal and to output a result of the third NOR operation to the fifth inverter;
a first NAND gating circuit configured to perform a first NAND operation an output signal of the fourth inverter and an output signal of the first NOR gating circuit and to output a result of the first NAND operation to a second input terminal;
a second NAND gating circuit configured to perform a second NAND operation on an output signal the third inverter and an output signal of the fifth inverter and to output a result of the second NAND operation to a second inverting input terminal;
a first PMOS transistor connected between a power terminal and a first node and having a gate connected to the first input terminal;

a second PMOS transistor connected between the power terminal and the first node and having a gate connected to the second input terminal;
a third PMOS transistor connected between the first node and a second node and having a gate connected to an output terminal of the first input terminal, the second node being connected to an output terminal outputting a result of the parallel bit test operation;
a fourth PMOS transistor connected between the first node and the second node and having a gate connected to the second inverting input terminal;
a first NMOS transistor connected between the second node and a third node and having a gate connected to the output terminal of the first inverter;
a second NMOS transistor connected between the second node and the third node and having a gate connected to the second input terminal;
a third NMOS transistor connected between the third node and a ground terminal and having a gate connected to the first input terminal; and
a fourth NMOS transistor connected between the third node and the ground terminal and having a gate connected to the second inverting input terminal.

9. The memory device as claimed in claim 8, wherein the first test ignore signal corresponds to a data bit '0,' and the second test ignore signal corresponds to a data bit '1'.

10. The memory device as claimed in claim 8, wherein the parallel bit test signal, the test pass signal, the first test ignore signal, and the second test ignore signal are generated from a mode register set in the parallel bit test operation.

11. The memory device as claimed in claim 8, wherein in the parallel bit test operation, the test pass signal is independently received according to the bank.

12. The memory device as claimed in claim 8, wherein in the parallel bit test operation, the same test pass signal is received in any one bank group.

13. The memory device as claimed in claim 12, wherein any one bank group is a first bank group.

* * * * *